United States Patent
Davis

(10) Patent No.: US 8,580,658 B1
(45) Date of Patent: Nov. 12, 2013

(54) METHODS FOR FABRICATING GRAPHENE DEVICE TOPOGRAPHY AND DEVICES FORMED THEREFROM

(71) Applicant: Mark Alan Davis, Springville, UT (US)

(72) Inventor: Mark Alan Davis, Springville, UT (US)

(73) Assignee: Solan, LLC, Salt Lake City, UT (US)

( * ) Notice: Subject to any disclaimer, the term of this patent is extended or adjusted under 35 U.S.C. 154(b) by 0 days.

(21) Appl. No.: 13/910,026

(22) Filed: Jun. 4, 2013

Related U.S. Application Data

(60) Provisional application No. 61/745,464, filed on Dec. 21, 2012.

(51) Int. Cl.
H01L 21/20 (2006.01)

(52) U.S. Cl.
USPC ........ 438/478; 438/510; 257/9; 257/E21.041; 977/734

(58) Field of Classification Search
USPC ........ 438/283, 510, 478; 257/9, 77, E21.041, 257/E21.135; 977/734
See application file for complete search history.

(56) References Cited

U.S. PATENT DOCUMENTS

| | | | |
|---|---|---|---|
| 6,316,715 B1 | 11/2001 | King et al. | |
| 6,660,928 B1 | 12/2003 | Patton et al. | |
| 8,076,204 B2 * | 12/2011 | Anderson et al. | 438/283 |
| 8,268,180 B2 | 9/2012 | Arnold et al. | |
| 2012/0003438 A1 | 1/2012 | Appleton et al. | |
| 2012/0068152 A1 | 3/2012 | Hwang et al. | |
| 2012/0085991 A1 | 4/2012 | Cohen et al. | |
| 2012/0141799 A1 | 6/2012 | Kub et al. | |
| 2012/0181507 A1 | 7/2012 | Dimitrakopoulos et al. | |
| 2012/0205518 A1 | 8/2012 | Voutilainen et al. | |
| 2012/0228157 A1 | 9/2012 | Li et al. | |
| 2013/0146846 A1 * | 6/2013 | Adkisson et al. | 257/27 |

FOREIGN PATENT DOCUMENTS

| | | |
|---|---|---|
| EP | 1 429 378 B1 | 2/2012 |
| WO | WO 2009/148679 A2 | 12/2009 |
| WO | WO 2010/147860 A1 | 12/2010 |
| WO | WO 2012/035551 A1 | 3/2012 |
| WO | WO 2012/120264 A1 | 9/2012 |
| WO | WO 2012/125898 A1 | 9/2012 |

OTHER PUBLICATIONS

Avouris et al., "Carbon-based electronics," *nature nanotechnology*, vol. 2, Oct. 2007, pp. 605-615.

(Continued)

*Primary Examiner* — Jarrett Stark
*Assistant Examiner* — Shahed Ahmed
(74) *Attorney, Agent, or Firm* — Morgan, Lewis & Bockius LLP

(57) ABSTRACT

Methods for forming graphite-based structures, in which a substrate is patterned to form a plurality of elements on the substrate, are provided. A trench separates a first element from an adjacent element in the plurality. The surface of the first element and the surface of the trench (i) are respectively characterized by different first and second elevations and (ii) are separated by a side wall of the first element. Orthogonal projections of the surface of the first element and the surface of the trench onto a common plane are contiguous or overlapping. In the method, a first graphene layer on the entire first surface and a second graphene layer on the entire second surface are concurrently generated. The second graphene layer has a thickness that is less than a difference between the first and second elevations. Thus, a graphite-based structure having isolated first and second graphene layers is formed.

30 Claims, 16 Drawing Sheets

(56) References Cited

OTHER PUBLICATIONS

Bae et al., "Roll-to-roll production of 30-inch grapheme films for transparent electrodes," *Nature Nanotechnology*, vol. 5, Aug. 2010, pp. 574-578.

Barone et al., (2006) "Electronic Structure and Stability of Semiconducting Graphene Nanoribbons" Nano Letters vol. 6, No. 12, pp. 2748-2754.

Behnam, et al., (2011) "Electronic Transport in Graphitic Nanoribbon Films," ACSNANO.org, vol. 5, No. 3 1617-1622.

Berger et al., "Electronic Confinement and Coherence in Patterned Epitaxial Graphene," *Science*, vol. 312, May 26, 2006, pp. 1191-1196.

Blankenburg et al., "Intraribbon Heterojunction Formation in Ultranarrow Graphene Nanoribbons," ACSNANO.org, vol. 6, No. 3, (2012) pp. 2020-2025.

Cai et al., "Atomically precise bottom-up fabrication of graphene nanoribbons," *Nature*, vol. 466, Jul. 22, 2010, pp. 470-473.

Chang et al., "Multilayered graphene efficiently formed by mechanical exfoliation for nonlinear saturable absorbers in fiber mode-locked lasers," *Applied Physics Letters*, 97, 211102 (2010) pp. 211102-1-211102-3.

Ci et al., "Controlled Nanocutting of Graphene," *Nano Res* (2008), 1: 116-122.

Coletti, et al., (2010) "Charge neutrality and band-gap tuning of epitaxial graphene on SiC by molecular doping" *Physical Review B 81*, 235401, 235401-1-235401-8.

Cotal, et al., (2009) "III-V multijunction solar cells for concentrating photovoltaics," *Energy Environ. Sci.*, 2, 174-192.

Datta et al., "Crystallographic Etching of Few-Layer Graphene," *Nano Letters*, 2008, vol. 8, No. 7, pp. 1912-1915.

Elias, et al., (2010) "Longitudinal Cutting of Pure and Doped Carbon Nanotubes to Form Graphitic Nanoribbons Using Metal Clusters as Nanoscalpels," *Nano Letters* 10, 366-372.

Ezawa, Motohiko, (2007) "Peculiar Band Gap Structure of Graphene Nanoribbons," *Physica Status Solidi* (c) 4, No. 2, 489, (8 pages).

Finkenstadt, et al., (2007) "From graphene to graphite: A general tight-binding approach for nanoribbon carrier transport," *Physical Review B* 76, 121405(R), 121405-1-121405-4.

Fonash, Stephen J., "Schottky-Barrier-Type Optoelectronic Structures, " *Metal-Semiconductor Schottky Barrier Junctions and Their Applications*, Ed. By B.L. Sharma, Plenum Press, 1984, pp. 161-189.

Fujii at al., "Cutting of Oxidized Graphene into Nanosized Pieces," *J. Am Chem. Soc.* 2010, 132, pp. 10034-10041.

Gao et al., "Oxidation Unzipping of Stable Nanographenes into Joint Spin-Rich Fragments," *J. Am. Chem. Soc.* (2009), 131, 9663-9669.

Giovannetti, at al., (2008) "Doping Graphene with Metal Contacts," *PRL* 101, 026803-1-026803-4.

Guo, et al., (2011) "Graphene Doping: A Review," *Insciences J.*, 80-89; doi: 10.5640/insc.010280.

Guo, et al., (2011), "Graphene Based Materials: Enhancing Solar Energy Harvesting," *Adv. Energy Mater*. 1, 448-452.

Gupta et al., " Schottky Barrier Photodiodes," *Metal-Semiconductor Schottky Barrier Junctions and Their Applications*, Ed. By B.L. Sharma, Plenum Press, 1984, pp. 191-218.

Hakala, et al., (2008) "First-principles study of adsorption, diffusion, and charge stability of metal adatoms on alkali halide surfaces" *Physical Review B* 78, 045418-1-045418-8.

Han et al., "Energy Band-Gap Engineering of Graphene Nanoribbons," *Physical Review Letters (PRL)* 98, 206805 (2007) pp. 206805-1-206805-4.

Henry, C.H., (1980) "Limiting efficiencies of ideal single and multiple energy gap terrestrial solar cells," *J. Appl. Phys.* 51, pp. 4494-4500: doi: 10.1063/1.328272.

Jayasena et al., "A novel mechanical cleavage method for synthesizing few-layer graphenes," *Nanoscale Research Letters*, 2011, 6:95, pp. 1-7.

Jia, et al., (2009) "Controlled Formation of Sharp Zigzag and Armchair Edges in Graphitic Nanoribbons" *Science* 323, 1701-1705.

Jiao at al., "Narrow graphene nanoribbons from carbon nanotubes," *Nature*, vol. 458, Apr. 16, 2009, pp. 877-880.

Kato at al., "Site- and alignment-controlled growth of graphene nanoribbons from nickel nanobars," *Nature Nanotechnology*, vol. 7, Oct. 2012, pp. 651-656.

Kim at al., "Large-scale pattern growth of graphene films for stretchable transparent electrodes," *Nature*, vol. 457, Feb. 5, 2009, pp. 706-710.

King, et al., (2000), "Next-Generation, High-Efficiency III-V Multifunction Solar Cells," *28th IEEE Photovoltaic Specialists Conference*, Anchorage, Alaska, Sep. 15-22, 2000 (4 pages).

Kosynkin et al., "Longitudinal unzipping of carbon nanotubes to form graphene nanoribbons, "*Nature*, vol. 458, Apr. 16, 2009, (7 pages).

Li, at al., "Chemically Derived, Ultrasmooth Graphene Nanoribbon Semiconductors," *Science*, 319, 1229 (2008), pp. 1229-1232.

Li, at al., (2010) "Graphene-On-Silicon Schottky Junction Solar Cells'" *Adv. Mater*. 22, 2743-2748.

Li, at al., "Large-Area Synthesis of High-Quality and Uniform Graphene Films on Copper Foils," *Science*, vol. 324, Jun. 5, 2009, pp. 1312-1314.

Lin, et al., (2008) "Electrical observation of subband formation in graphene nanoribbons," *Physical Review B* 78. 161409(R), 161409-1-161409-4.

Liu et al., "Band-gap scaling of graphene nanohole superlattices," *Physical Review B* 80, 233405 (2009), pp. 233405-1-233405-4.

Liu et al., "Stripe-kink microstructures formed in mechanical peeling of highly orientated pyrolytic graphite," *Applied Physics Letters*, 96, 201909 (2010), pp. 201909-1-201909-3.

Ma, et al., "Strain-Induced Orientation-Selective Cutting of Graphene into Graphene Nanoribbons on Oxidation," *Angew, Chem. Int. Ed.* 51, pp. 1161-1164 (2012).

McAllister et al., "Single Sheet Functionalized Graphene by Oxidation and Thermal Expansion of Graphite," *Chem, Mater*, 2007, 19, 4396-4404.

Patent Informatics Team, "An Analysis of Worldwide Patent Filings Relating to Graphene," *Intellectual Property Office*, Concept House, Cardiff Rd, Newport, South Wales, NP10 8QQ, UK, (2011), pp. 2-11.

Reina et al., "Large Area, Few-Layer Graphene Films on Arbitrary Substrates by Chemical Vapor Deposition," *Nano Letters*, 2009, vol. 9, No. 1, pp. 30-35.

Sinitskii et al., "Patterning graphene nanoribbons using copper oxide nanowires," *Applied Physics Letters*, 100, 103106 (2012), pp. 103106-1-103106-3.

Stauber, et al., (2008), "Optical conductivity of graphene in the visible region of the spectrum," *Physical Review B* 78, 085432, 085432-1-085432-8.

Sutter et al., "Epitaxial graphene on ruthenium," *Nature Materials*, vol. 7, May 2008, pp. 406-411.

Tapasztó et al., "Tailoring the atomic structure of graphene nanoribbons by scanning tunnelling microscope lithography," *Nature nanotechnology*, vol. 3, Jul. 2008, pp. 397-401.

Terrones, et al., (2010) "Graphene and graphite nanoribbons: Morphology, properties, synthesis, defects and applications," *Nano Today* 5, 351-372.

Tyagi, M.S., "Physics of Schottky Barrier Junctions," *Metal-Semiconductor Schottky Barrier Junctions and Their Applications*, Ed. By B.L. Sharma, Plenum Press, 1984, 1-60.

Wan, et al., (2011) "Graphene—A Promising Material for Organic Photovoltaic Cells," *Adv. Mater*. 23, 5342-5358.

Wu at al., "Efficient Synthesis of Graphene Nanoribbons Sonochemically Cut from Graphene Sheets," *Nano Res* (2010) 3: 16-22.

Xie et al., "Graphene Nanoribbons from Unzipped Carbon Nanotubes: Atomic Structures, Raman Spectroscopy, and Electrical Properties," *J. Am. Chem. Soc.* 2011, 133, pp. 10394-10397.

Yang et al., "Two-Dimensional Graphene Nanoribbons," *J. Am Chem. Soc.*, 2008, 130, 4216-4217.

Yastrebova, N., (Apr. 2007) "High-efficiency multi-junction solar cells: Current status and future potential" *Centre for Research in Photonics*, University of Ottawa (22 pages).

Zhang et al., "Fabrication and electric-field-dependent transport measurements of mesoscopic graphite devices," *Appl.Phys. Ltrs*, 86, 073104 (2005), 073104-1-073104-3.

\* cited by examiner

METHODS FOR FABRICATING GRAPHENE DEVICE TOPOGRAPHY AND DEVICES FORMED THEREFROM

CROSS REFERENCE TO RELATED APPLICATION

This application claims priority to U.S. Patent Application No. 61/745,464, filed Dec. 21, 2012 which is hereby incorporated by reference herein in its entirety.

1. FIELD OF THE DISCLOSURE

Methods for fabricating a graphite-based structure and graphite-based structures and devices formed therefrom are provided. More particularly, methods for fabricating a graphite-based structure with isolated graphene layers from patterned substrates are provided.

2. BACKGROUND

Graphite-based structures, e.g. graphene quantum dots, graphene nanoribbons (GNRs), graphene nanonetworks, graphene plasmonics and graphene super-lattices, exhibit many exceptional chemical, mechanical, electronic and optical properties, and are very desirable for use in electronic devices, composite materials, and energy generation and storage. Such graphite-based structures in general comprise a graphene layer, typically nanometers thick and having a characteristic dimension also in the nanometers range. For example, in order to obtain adequate band gaps for operation at room temperature, GNRs typically have a width within a few nanometers due to the inverse relationship between the band gap and the width of the GNRs. The specific geometrical requirements impose challenges in the development of fabrication methods that can produce graphite-based structures with controllable and reliable topography to achieve desired functionalities.

Another challenge in the development of fabrication methods is related to packing density. The ability to pack structures and devices onto a surface with high packing density is an important issue. Because packing density or workable surface area determines functionalities of devices such as efficiency of solar cells or detectors, extensive work has been dedicated to isolation of graphene layers and attempted to reduce or eliminate workable surface area loss. However, current techniques use horizontal isolation, resulting in workable surface area loss and thus a dissatisfactory yield.

Current methods for fabricating such graphite-based structures are complicated, expensive, inefficient and highly inconsistent, and are mainly limited to laboratories. These methods can be broadly classified as epitaxial growth, chemical vapor deposition (CVD) growth, colloidal suspension, unconventional methods and exfoliation (See, e.g., Jayasen and Subbiah, 2011, Nanoscale Research Letter, 6:95; Parrish, "Graphene Growth Techniques for Use in Nanoelectronics).

The exfoliation method involves separation of a thin layer from the bulk material. This technique can be further classified into thermal, chemical and mechanical methods. Mechanical exfoliation methods under development include the use of a sharp single crystal diamond wedge (See, Jayasen and Subbiah, 2011, Nanoscale Research Letter, 6:95), an atomic force microscope (See, Liu et al., 2005, Applied Physics Letters 86, 073104), and adhesive tapes (See, Liu et al., 2010, Applied Physics Letters 96, 201909 and Chang et al., 2010, Applied Physics Letters 97, 211102) to cleave a highly ordered pyrolytic graphite (HOPG) sample. The use of adhesive tapes for mechanical cleavage is the popular method because it is simple and cost-effective. However, using current mechanical exfoliation methods, it is difficult to predict the number of peels required to obtain the desired thickness of the thin layer (See, Jayasen and Subbiah, 2011, Nanoscale Research Letter, 6:95). Microstructure damage, such as stripes and corrugated kinks, have also been observed in the thin layers produced by current mechanical exfoliation methods (See, Liu et al., 2010, Applied Physics Letters, 96, 201909).

In the last few years, various methods have been developed in an attempt to fabricate graphite-based structures while achieving desired size, specified geometries, and characterized electronic properties of the graphite-based structures. These methods include (1) the combination of e-beam lithography and oxygen plasma etching; (2) stripping of graphite that is sonochemically processed; (3) bottom-up chemical synthesis, e.g., by cyclodehydrogenation of 1,4-diiodo-2,3,5, 6-tetraphenylbenzene, or 10,10'-dibromo-9,9'-bianthryl, polyanthrylene oligomers self-assembled on Au(111), Ag(111) or silica substrates; (4) electrochemical etching of graphene by scanning tunneling microscopy (STM) with high bias potential; (5) catalytic unzipping using metal nanoparticles on graphene; (6) chemical unzipping of carbon nanotubes, e.g., by argon plasma etching or oxidation; (7) etching with a nanowire mask; and (8) oxidative unzipping and cutting large scale graphene into GNRs.

While a width on the order of nanometers can be achieved using the above-identified methods, there are many drawbacks to using such methods. For example, the stripping of graphite that is sonochemically processed yields a large distribution of ribbon width, random edge directions, and a percentage yield around 0.5 percent. Similarly, bottom-up chemical synthesis suffers from difficulties in controlling edge geometry and size. Electrochemical etching of graphene by scanning tunneling microscopy (STM) with high bias potential is expensive and time-consuming. Catalytic unzipping using metal nanoparticles on graphene as well as chemical unzipping of carbon nanotubes, referenced above, are limited by the availability of carbon nanotubes. Etching with a nanowire mask is hindered by the complexity and difficulty in the positioning of nanowires. In addition, oxidative unzipping and cutting large scale graphene into GNRs is limited by a lack of control in the initial cutting position, the direction of cutting, and the spacing between different cuts. Consequently, the methods referenced above produce graphite-based structures with less usable surface area and dissatisfactory shapes and sizes.

On the other hand, economical synthesis of large-scale graphene sheets has been attempted. One particular method is characterized by CVD growth of graphene, making use of a high temperature furnace at a low or vacuum pressure to deposit atoms onto on a metal substrate (Parrish, "Graphene Growth Techniques for Use in Nanoelectronics," last accessed from cerc.utexas.edu/~kparrish/class/Graphene_Synthesis.pdf on Dec. 6, 2012). Different metal substrates have been used to grow graphene via CVD, such as platinum, iridium, ruthenium, nickel, and copper. Copper is a suitable substrate due to the success in etching away the substrate, the success in transferring the graphene from the copper, the low solubility of carbon in copper, and the relatively low cost of copper. One issue with CVD is the difference in thermal expansion coefficient between the substrate and the graphene sheets, leading to rippling. Another issue is transferring the graphene sheets to a different substrate if needed.

Another method is characterized by epitaxial growth of graphene. It is a heteroepitaxial process using a seed crystal to grow an identical crystal structure in a different substrate. Because of this, epitaxial growth requires careful substrate choice in order to recreate the hexagonal lattice of graphene (See, Parrish, "Graphene Growth Techniques for Use in Nanoelectronics," last accessed Dec. 6, 2012 from cerc.utex-as.edu/~kparrish/class/Graphene_Synthesis.pdf. Materials explored for use as suitable substrates include silicon carbide, silicon, germanium, and transition metal materials such as iridium(111), ruthenium(0001), platinum(111), cobalt (0001), nickel(111), and palladium(111). A popular substrate comprises silicon carbide (SiC).

In one approach, a SiC substrate is heated to an elevated temperature, thereby thermally decomposing the substrate and leaving carbon to form graphene sheets on a substrate surface. An example in which silicon carbide substrate is used for graphene growth is found in Deheer, International Publication No. WO 201225898. Deheer discloses a method for making a graphitic ribbon through annealing silicon carbide. The resultant graphene feature has a V-shaped cross section in a face of a carbide crystal.

One issue with growing graphene using SiC exists in the difficulty of controlling the number of graphene sheets and the grain sizes. Thus, to date, graphene growth using SiC substrates has yielded structures with unsatisfactory mobility characteristics (Berger et al. "Electronic Confinement and Coherence in Patterned Epitaxial Graphene" Science, 2006, 312(5777) 1191-6 and 1-lass et al. "Why Multilayer Graphene on 4H—SiC(0001) Behaves Like a Single Sheet of Graphene" Phys. Rev. Lett. 2008, 100, 125504). Another issue exists in growing isolated graphene layers on selected surfaces since graphene grows on all untreated SiC surfaces. Additional subsequent processes such as etching are required to remove the graphene layer from surfaces where graphene growth is undesired and to isolate the desirable graphene layers.

To control the number of graphene sheets, substrates other than SiC have been explored. One such example is disclosed in Appleton and Gila (See, U.S. Patent Application No. 2012/0003438 A1). Appleton and Gila describe a method for fabricating a graphene feature by forming an amorphous carbon doped semiconductor on the crystalline semiconductor substrate and then epitaxially crystallizing the amorphous semiconductor with carbon migration to the surface. Appleton and Gila attempt to fabricate a graphene feature over a large area.

Given the above background, there is a need in the art for fabrication methods that are simple and at the same time can produce controllable, reliable and precise graphite-based structures with high packing density.

3. SUMMARY

The present disclosure provides methods for fabricating a graphite-based structure and graphite-based structures and devices formed therefrom. One aspect of the present disclosure provides a method that comprises patterning a substrate to define the desired structure and then generating graphene layers on selected surfaces after patterning the substrate. In some embodiments, patterning the substrate is conducted with an obtuse/reentrant angle to produce a graphite-based structure with graphene layers spatially isolated yet continuous or overlapping on a common plane.

In some embodiments the substrate is selectively doped with carbon to produce a carbide layer in the substrate within a selected surface. Doping the substrate with carbon is generally conducted after patterning the substrate but prior to generating graphene layers, and can be achieved, for example, using ion implantation methods.

In still another aspect of the present disclosure a selected surface, where graphene growth is undesired, is passivated to inhibit graphene growth on the selected surface. The passivation process is conducted prior to the graphene generation, and is in general conducted after doping the substrate with carbon if both doping and passivation processes are employed. In some embodiments, the passivation is achieved by depositing a protection layer or layers on the selected surface. In some embodiments, the passivation is achieved by oxidation.

In some embodiments, the method further comprises doping the substrate with a dopant to produce charger carriers within a graphene layer or doping the substrate with two or more different dopants to produce a junction within a graphene layer. When the substrate comprises a semiconducting material, doping the substrate can be conducted either prior to or after the graphene generation. When the substrate comprises a dielectric material or a metallic material, doping the substrate with the first dopant is conducted after the graphene generation. In some embodiments, doping is further performed to form a doped region within an element or within the substrate.

Various other aspects of the present disclosure provide graphene device topography fabricated by the methods of the present disclosure. Exemplary graphene device topography of the present disclosure can be used as diodes, transistors, LEDs, solar cells, photodetectors, or other graphene devices.

One aspect of the present disclosure provides a graphene device topography comprising a plurality of elements and trenches. While graphene layers generated on elements are isolated from graphene layers generated on trenches, orthogonal projections of these graphene layers on a common plane are continuous or overlapping. The elements and trenches have various configurations. In some embodiments, the elements are ribs, ribbons, pillars, mesas, or suitable geometries for plasmonic effects.

Another aspect of the present disclosure provides a graphene device topography having a doped sub-layer or a doped portion within a graphene layer. The doped sub-layers or the doped portions within a graphene layer can form a junction or a bipolar junction. In some embodiments, doping is also performed on an element or the substrate to form one or more doped regions in the element or the substrate. Depending on the substrate materials, the dopant used or other factors, the doped region can form ohmic or non-ohmic contact with a respective graphene layer. In some embodiments, it forms a Schottky barrier with the graphene layer. In some embodiments, the doped region acts as a ground tap, an interconnector, or an isolation feature that separates a respective graphene layer from other features.

4. BRIEF DESCRIPTION OF THE DRAWINGS

The accompanying drawings, which are incorporated into and constitute a part of this specification, illustrate one or more embodiments of the present application and, together with the detailed description, serve to explain the principles and implementations of the application.

Figure 1:
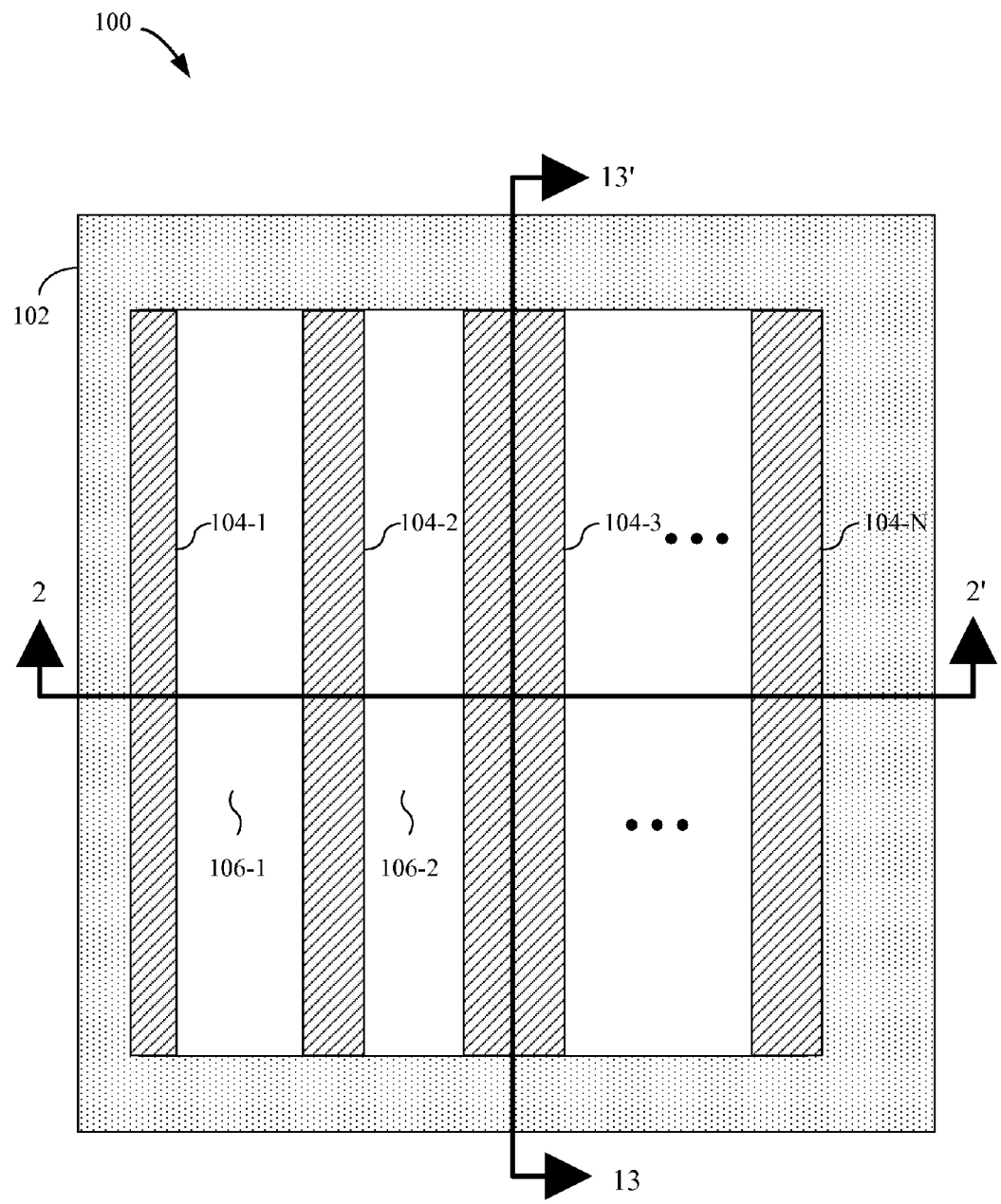
FIG. 1 illustrates a top view of an exemplary graphene device topography fabricated by exemplary methods in accordance with an embodiment of the present disclosure.

FIG. 2C illustrates a cross-sectional view of the exemplary graphene device topography taken along line 2-2' of FIG. 1 and fabricated by still another exemplary method in accordance with an embodiment of the present disclosure.

Figure 3:
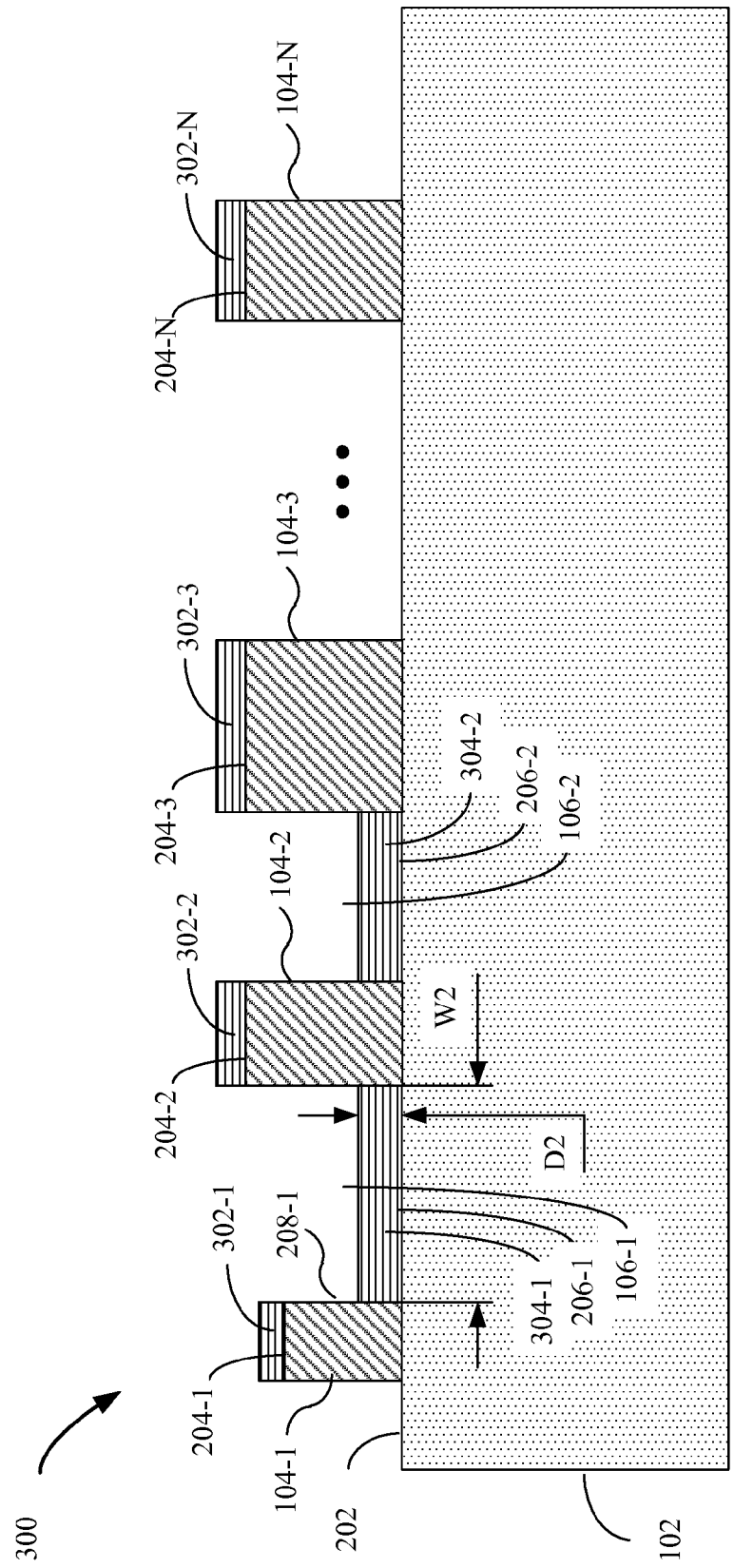

FIG. 3 illustrates an exemplary graphene device topography fabricated by exemplary methods and having continuous orthogonal projections on a common plane in accordance with an embodiment of the present disclosure.

Figure 4A:
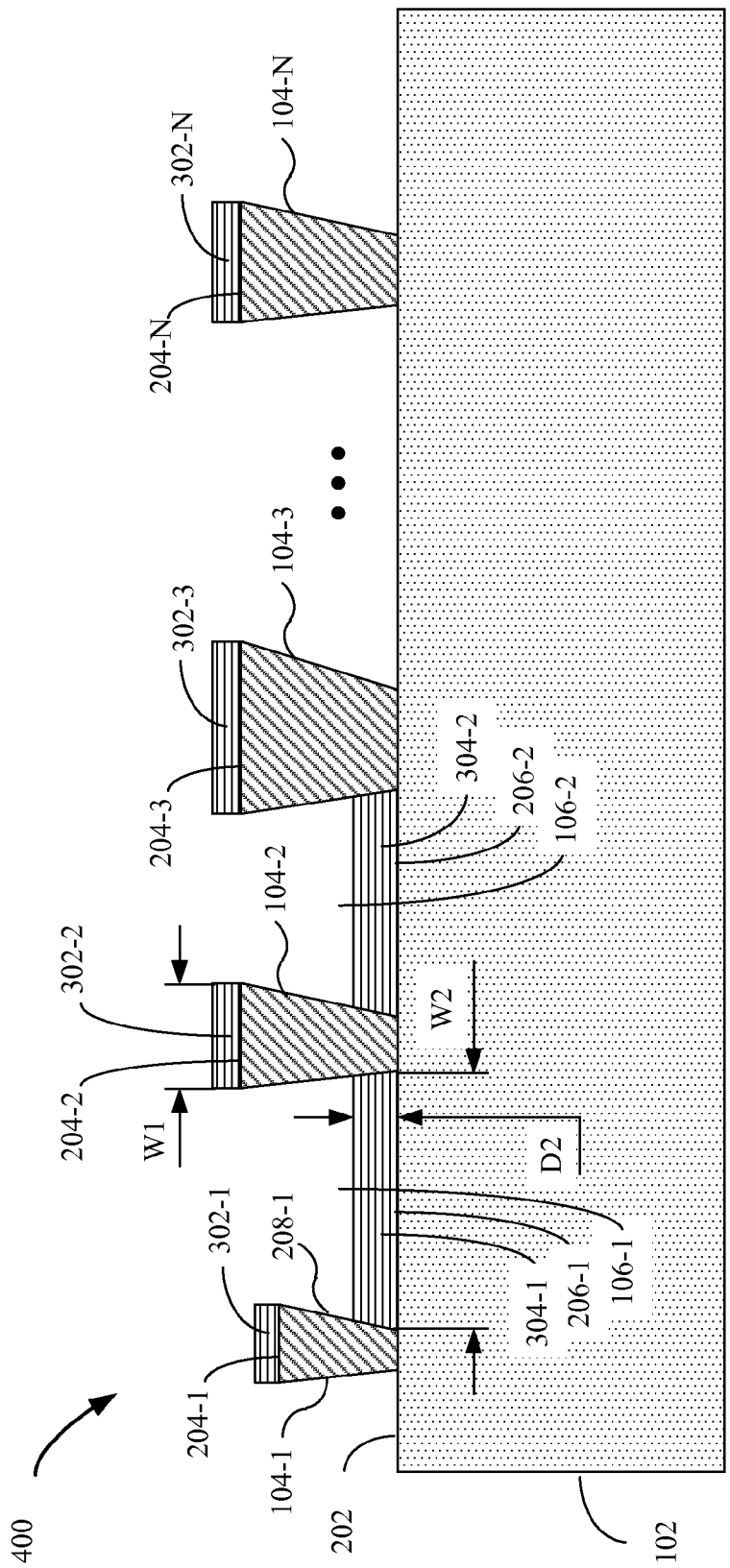

FIG. 4A illustrates an exemplary graphene device topography fabricated by exemplary methods and having overlapping orthogonal projections on a common plane in accordance with an embodiment of the present disclosure.

Figure 4B:
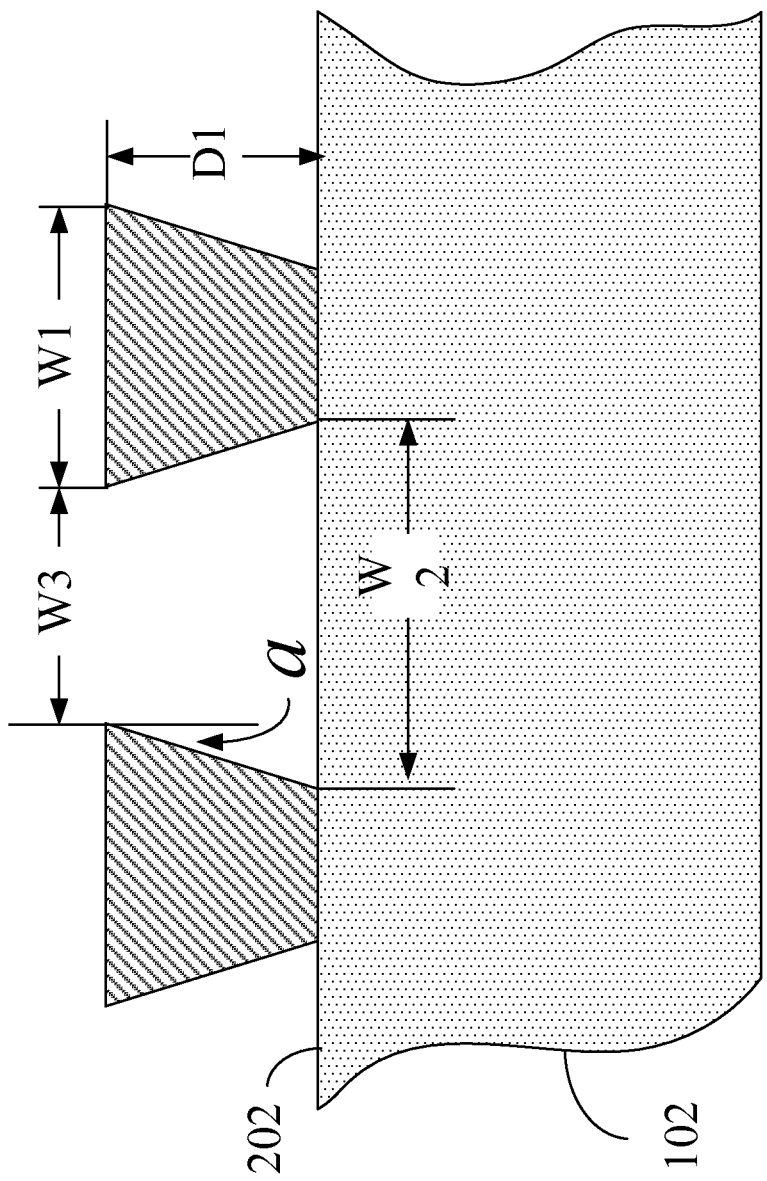

FIG. 4B illustrates additional surface area achieved by an exemplary graphene device topography having overlapping orthogonal projections on a common plane in accordance with an embodiment of the present disclosure.

Figure 5:
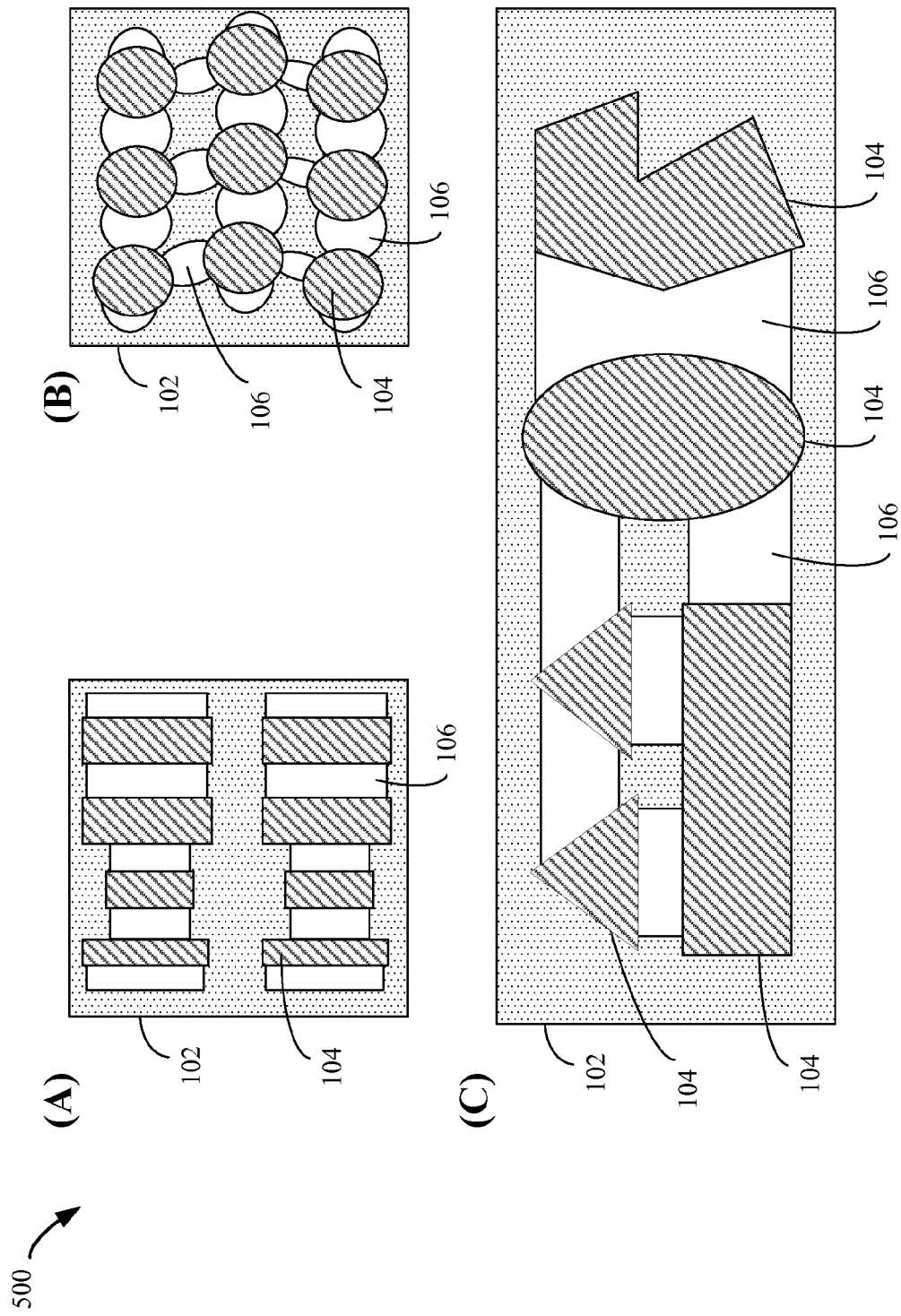

FIG. 5A illustrates an alternative exemplary graphene device topography fabricated by exemplary methods in accordance with an embodiment of the present disclosure.

FIG. 5B illustrates another alternative exemplary graphene device topography fabricated by exemplary methods in accordance with an embodiment of the present disclosure.

FIG. 5C illustrates yet another alternative exemplary graphene device topography fabricated by exemplary methods in accordance with an embodiment of the present disclosure.

Figure 6:
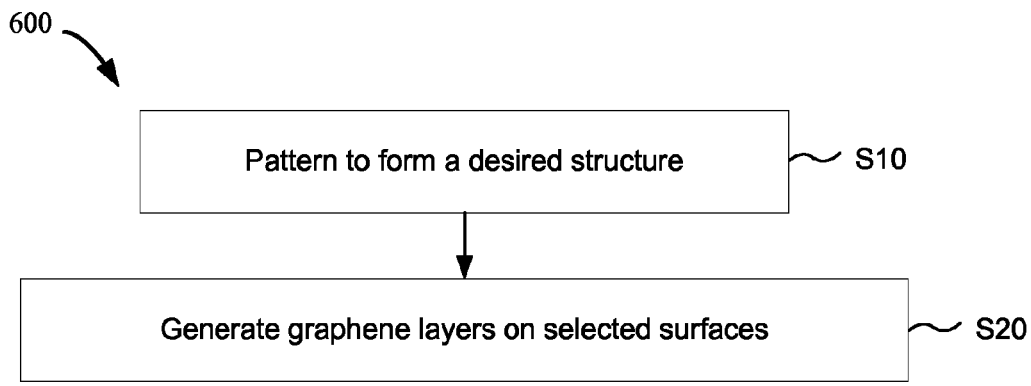

FIG. 6 provides a flowchart of an exemplary method for fabricating graphene device topography on a substrate in accordance with an embodiment of the present disclosure.

Figure 7:
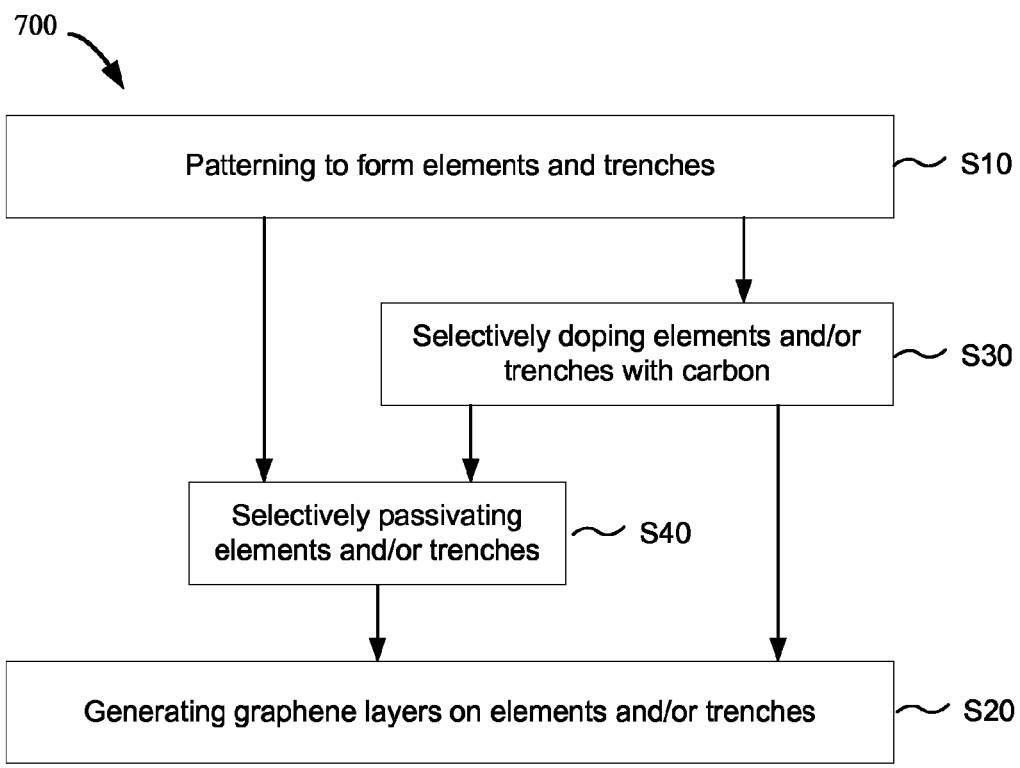

FIG. 7 provides a flowchart of another exemplary method for fabricating graphene device topography on a substrate in accordance with an embodiment of the present disclosure.

Figure 8:
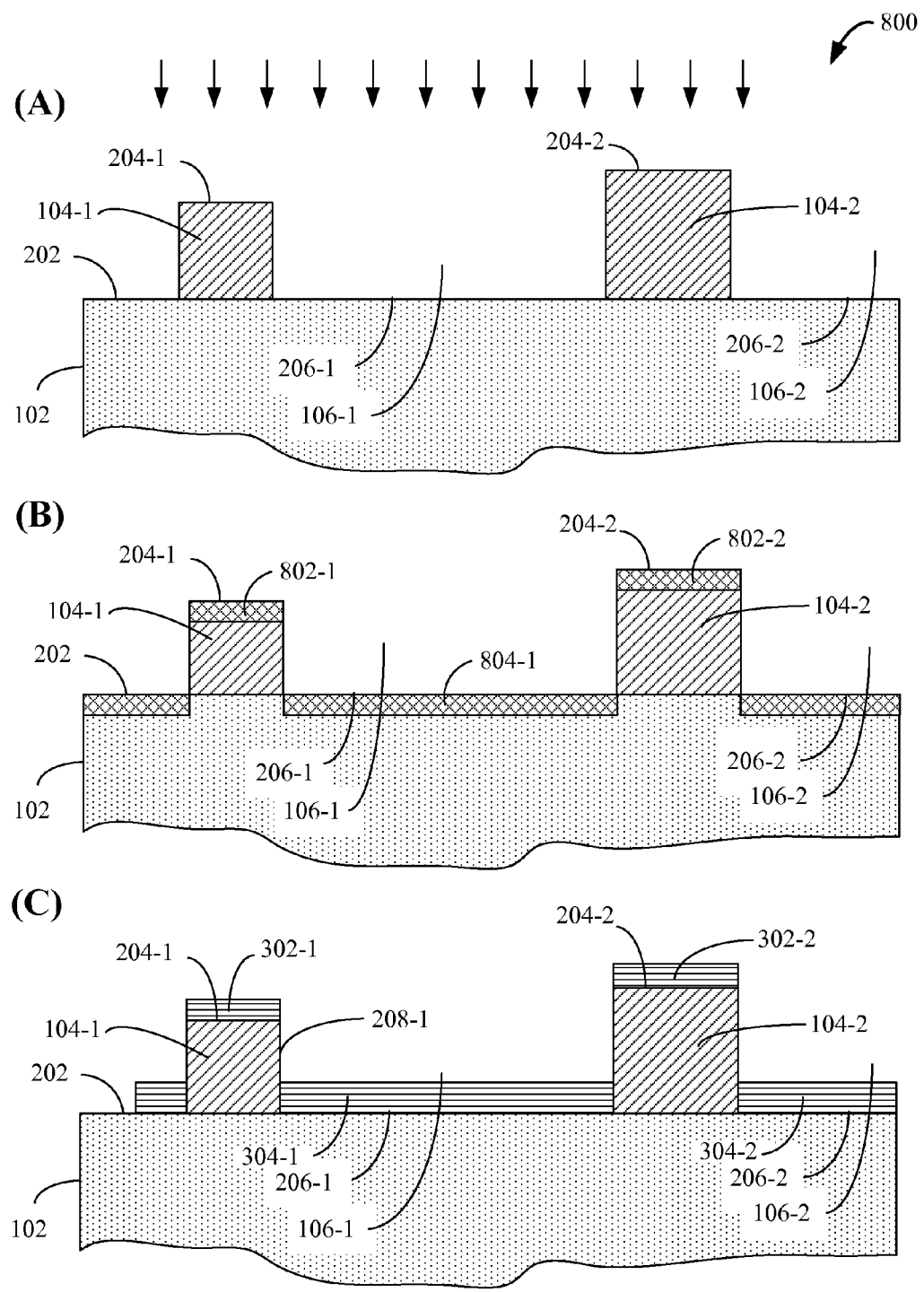

FIG. 8 illustrates an exemplary doping method for producing a carbide layer at a selected surface of a defined topography in accordance with an embodiment of the present.

Figure 9:
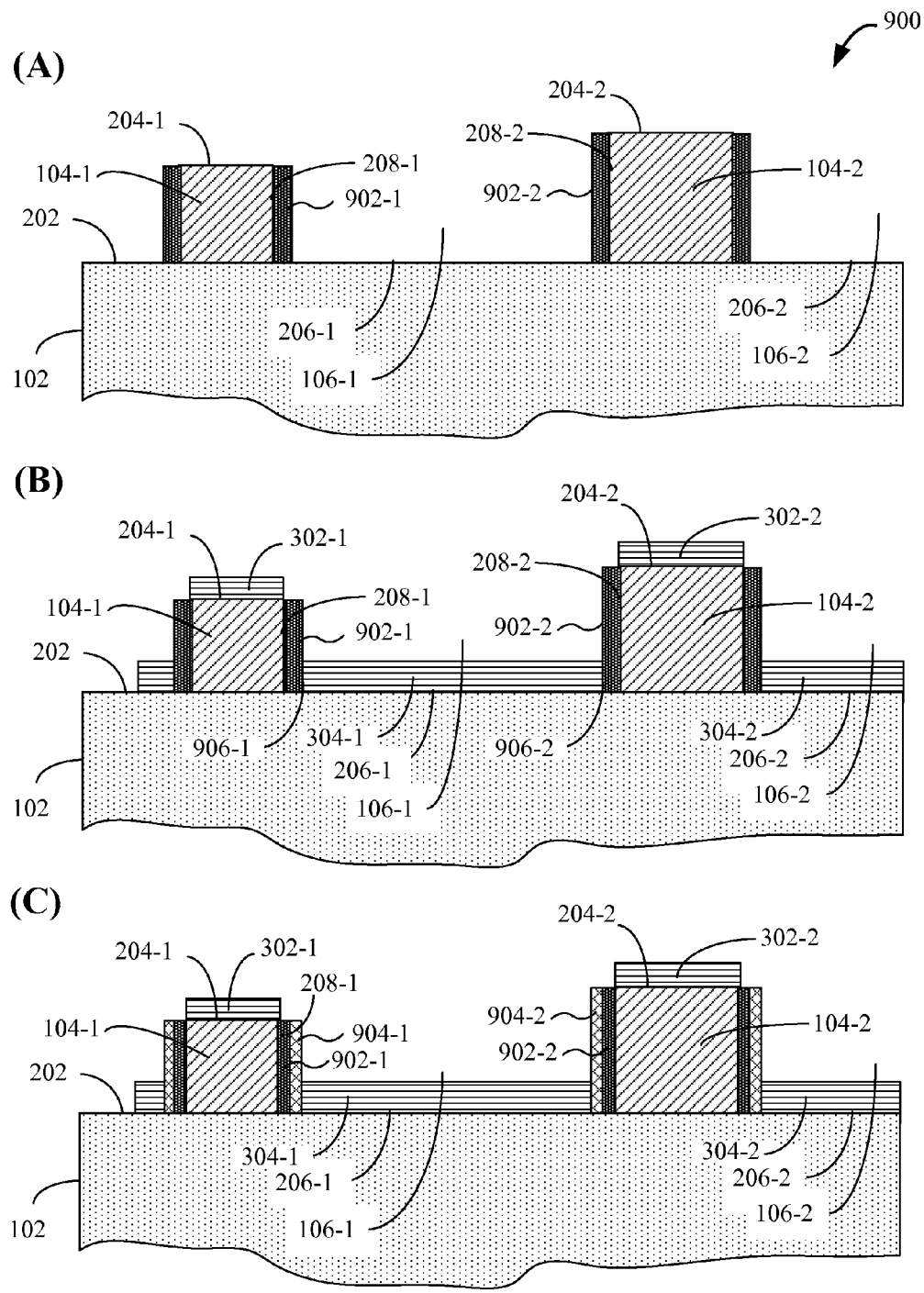

FIG. 9 illustrates an exemplary method for passivating a selected surface of a defined topography in accordance with an embodiment of the present disclosure.

Figure 10:
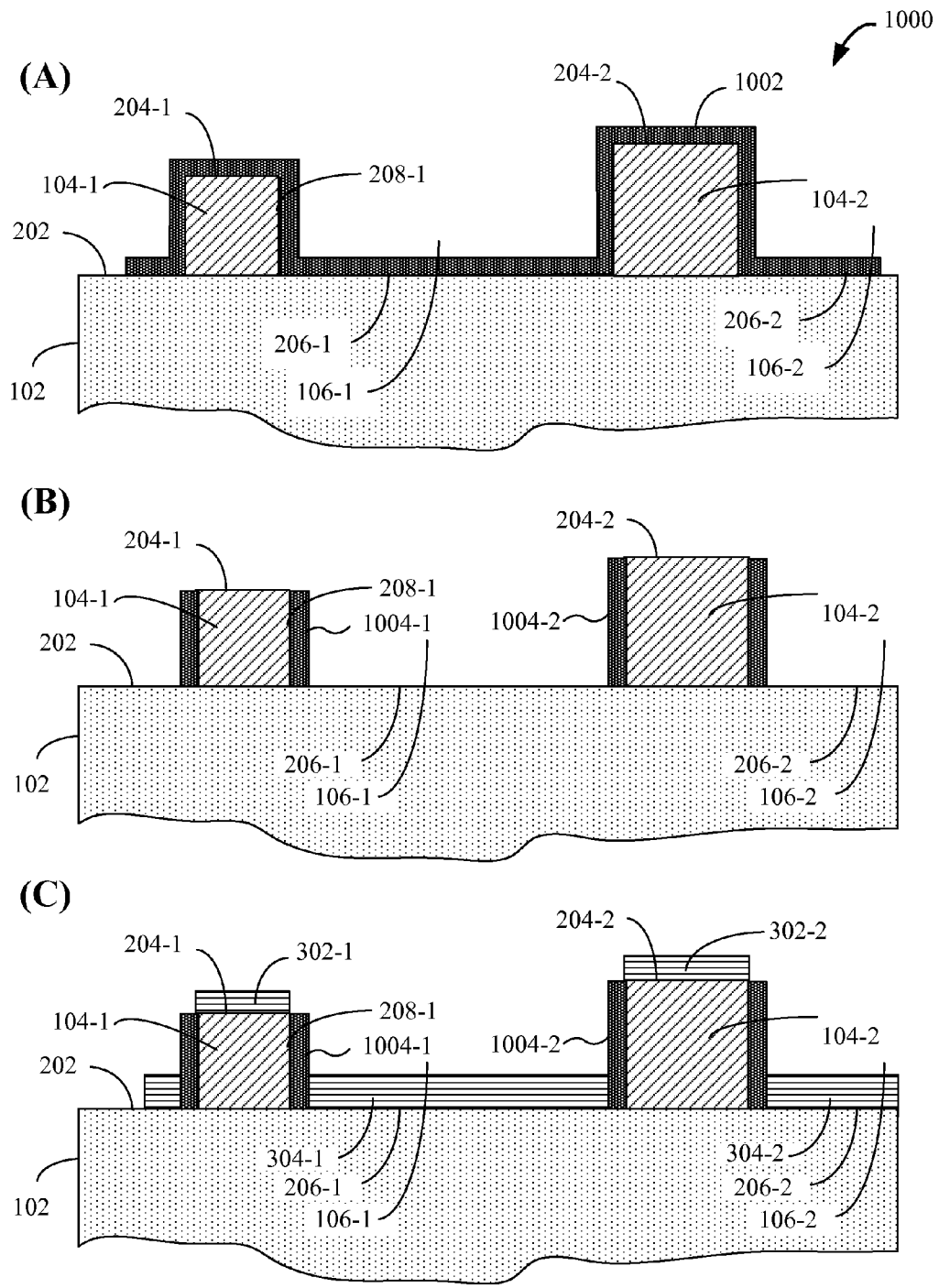

FIG. 10 illustrates another exemplary method for passivating a selected surface of a defined topography in accordance with an embodiment of the present disclosure.

Figure 11:
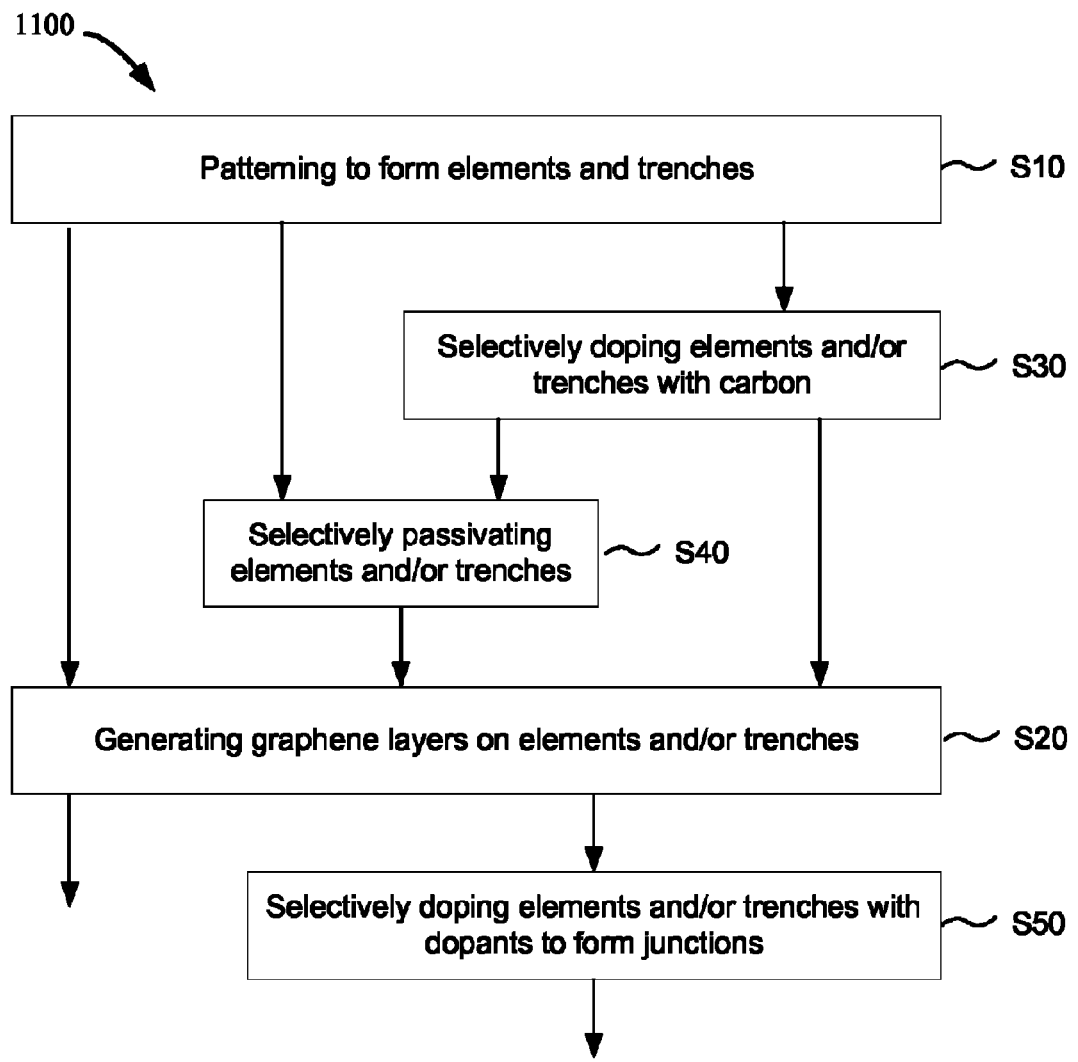

FIG. 11 provides a flowchart of yet another exemplary method for fabricating graphene device topography on a substrate in accordance with an embodiment of the present disclosure.

Figure 12:
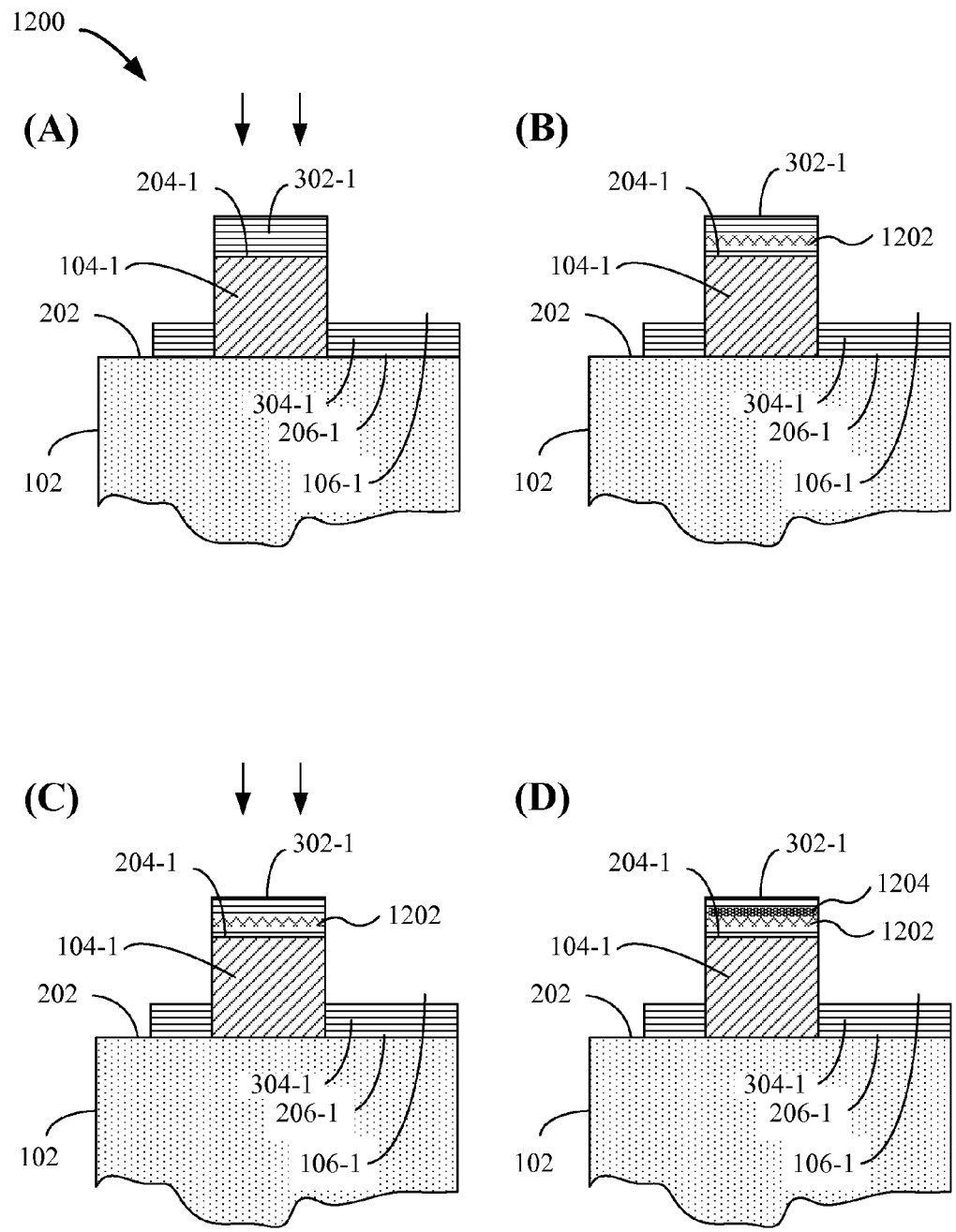

FIG. 12 illustrates an exemplary doping method for producing a doped graphene sub-layer and an exemplary resultant graphene device topography in accordance with an embodiment of the present disclosure.

Figure 13:
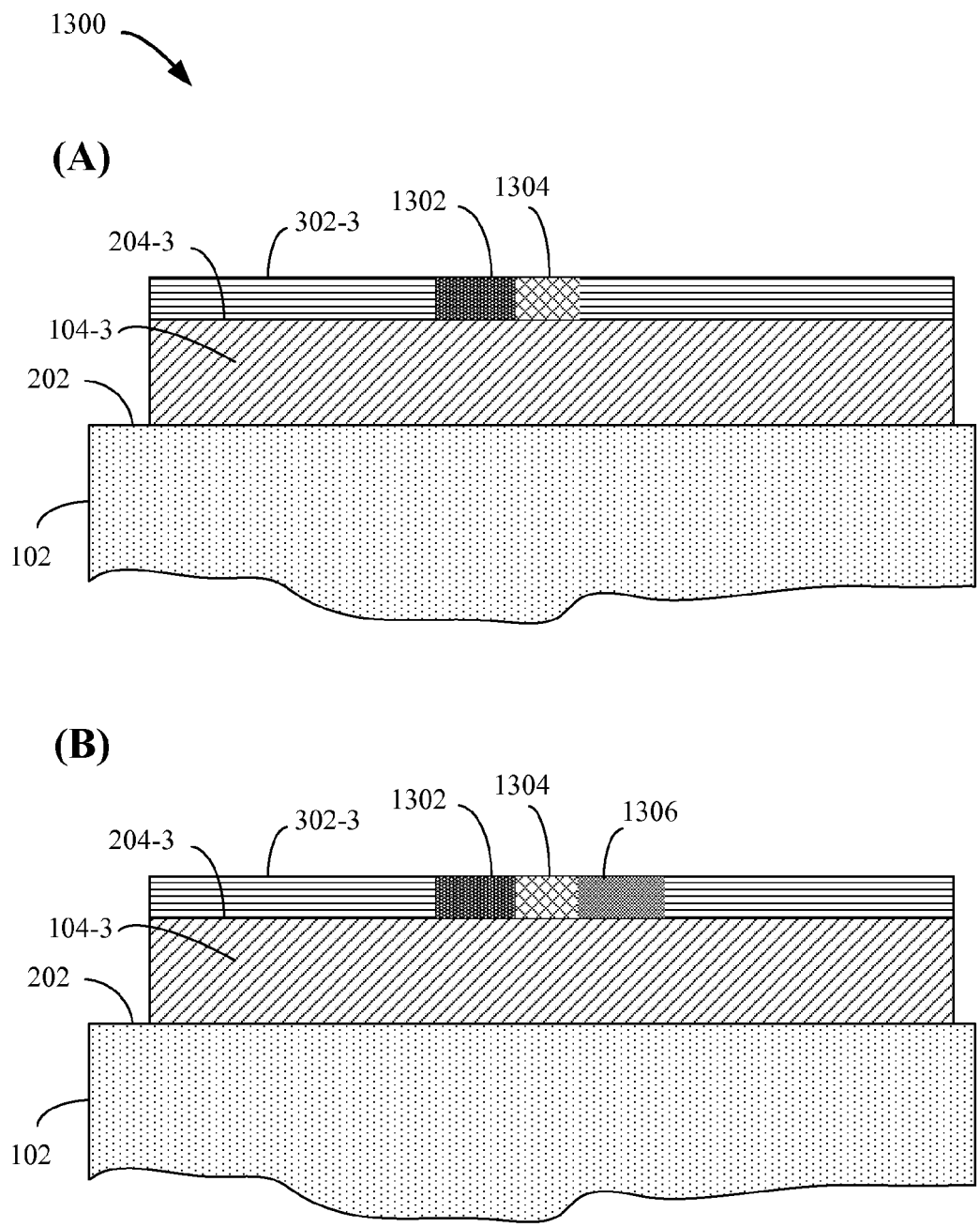

FIG. 13 illustrates another exemplary doping method for producing a doped graphene sub-layer and an exemplary resultant graphene device topography in accordance with an embodiment of the present disclosure.

Figure 14:
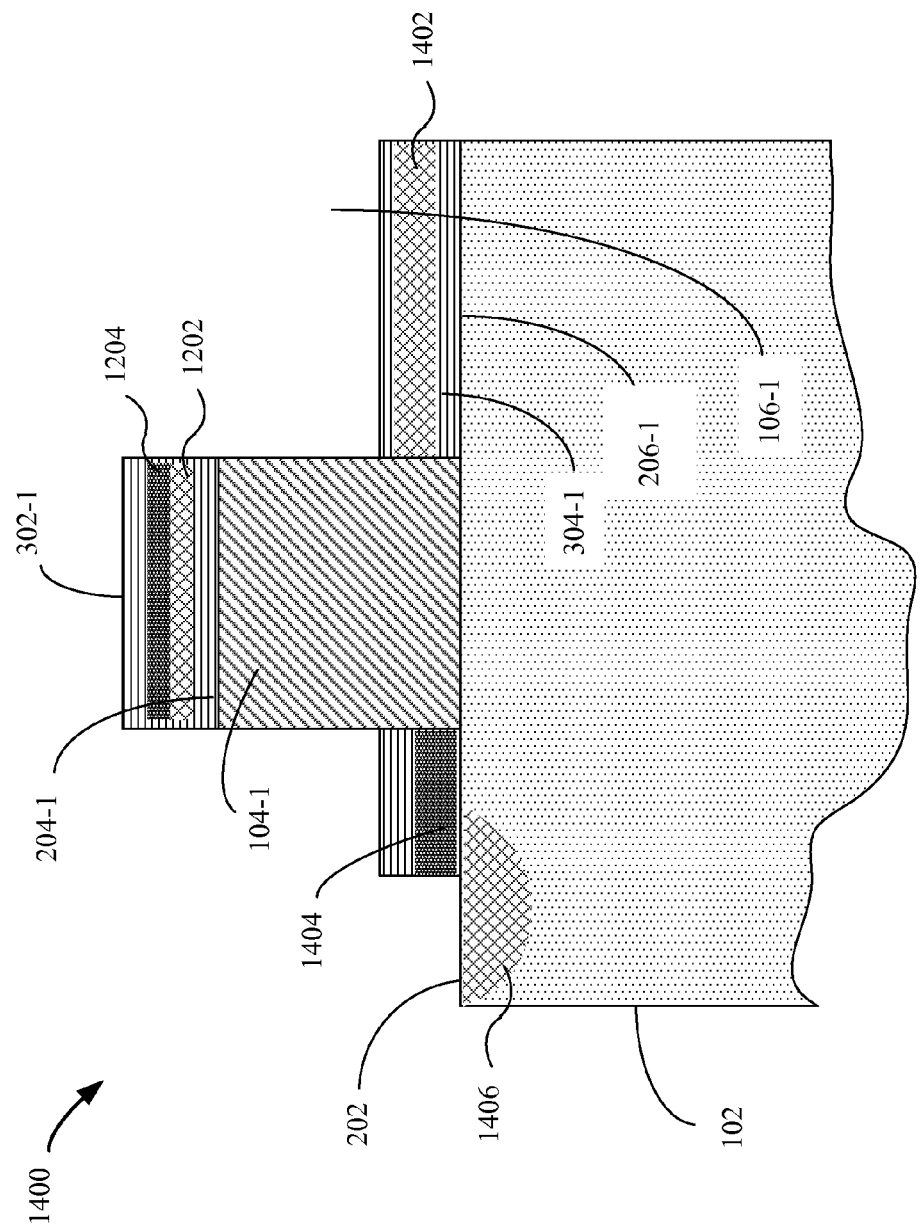

FIG. 14 illustrates another exemplary graphene device topography in accordance with an embodiment of the present disclosure.

Figure 15:
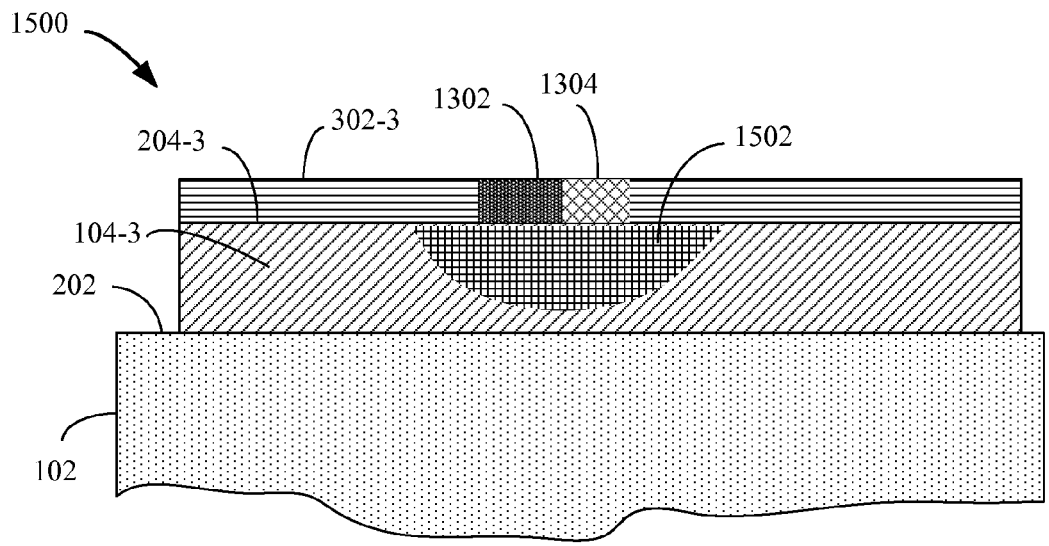

FIG. 15 illustrates yet another exemplary graphene device topography in accordance with an embodiment of the present disclosure.

Figure 16:
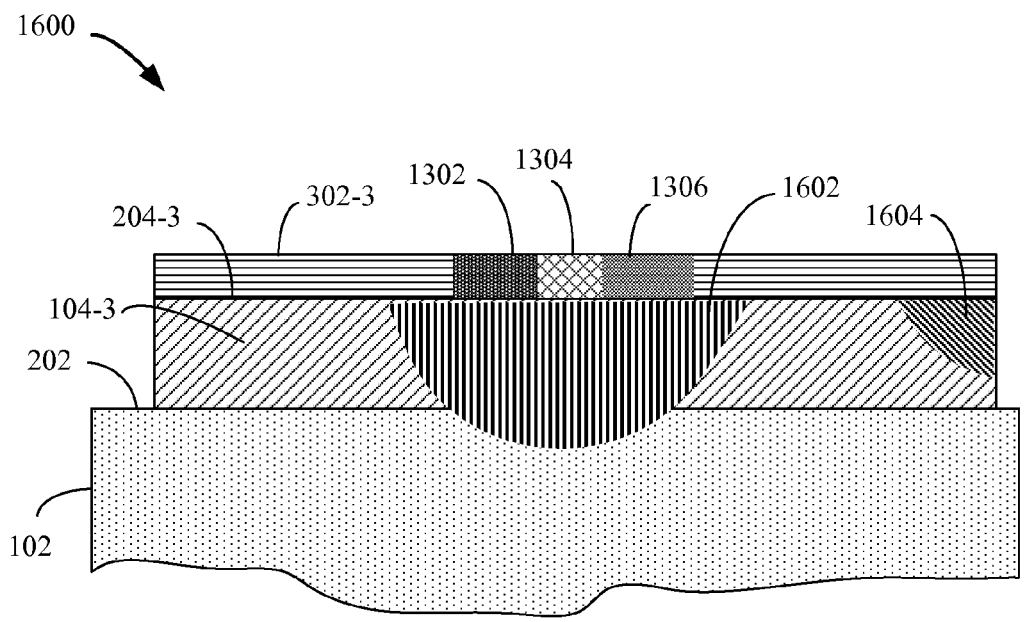

FIG. 16 illustrates still another exemplary graphene device topography in accordance with an embodiment of the present disclosure.

Figure 17:
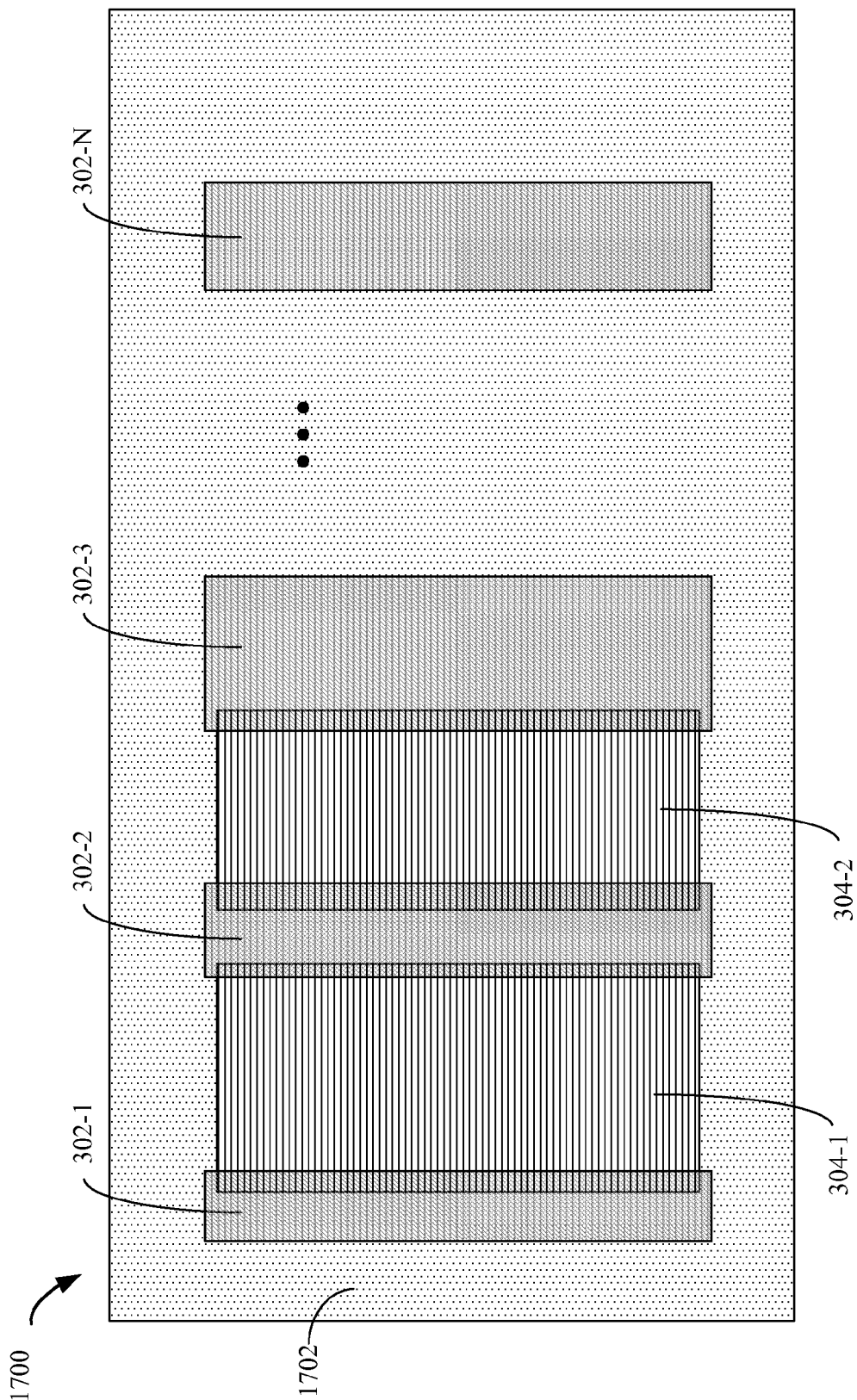

FIG. 17 illustrates a first orthogonal projection of a first surface and a second orthogonal projection of a second surface onto a common plane in accordance with an embodiment of the present disclosure.

5. DETAILED DESCRIPTION

Embodiments of the present application are described in the context of graphene device topography and in the context of methods for fabricating the topography or graphite-based structures on a substrate. Exemplary topography or structures include graphene layers generated on a plurality of elements and/or on a plurality of trenches that separate the elements. The graphene layers generated on elements and trenches are continuous or overlapping on a common plane while being isolated from each other on a plane substantially orthogonal to the common plane. Such structures provide additional surface areas for absorbing or emitting photons, thereby enhancing functionalities of devices such as efficiency of solar cells or photodetectors.

Exemplary methods include patterning a substrate to form or define a desired topography and generating a graphene layer on a selected surface. Patterning a substrate is conducted prior to the graphene generation. Such methods provide several advantages over conventional methods, including ease of fabrication as well as precision and capability of fabricating complex or composite structures. Exemplary methods further include various additional, optional, or alternative processes such as doping or passivation processes if desired. Exemplary methods of the present application can be used to fabricate graphite-based diodes, transistors, LEDs, solar cells, photodetectors, or other devices, or any combination thereof.

Those of ordinary skill in the art will realize that the following detailed description of the present application is illustrative only and is not intended to be in any way limiting. Other embodiments of the present application will readily suggest themselves to such skilled persons having benefit of this disclosure. Reference will now be made in detail to implementations of the present application as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

5.1. DEFINITIONS

It will be understood that, although the terms "first," "second," etc. are optionally used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element"

are renamed consistently and all occurrences of the second element are renamed consistently. The first element and the second element are both elements, but they are not the same element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

As used herein, the term "sheet" refers to a substantially two-dimensional or one-atom thick substance. For example, a "graphene sheet" refers to one-atom-thick substance with carbon atoms arranged in a hexagonal lattice. A "graphene sheet" also refers to a carbon-based sheet which comprises additional materials such as boron, oxides, dopants and/or edge atomic substitutes.

As used herein, the term "graphene layer" or "graphite layer" refers to a graphene sheet, or refers to several, several tens, several hundred or several thousands of graphene sheets. The thickness of a graphene layer can range from a nanometer to several micrometers, or to several tens of micrometers. Final graphene layers produced by the processes disclosed in this application can have a thickness in nanometers, and preferably less than fifty nanometers. The terms "graphene layer" and "graphite layer" are interchangeable in the present disclosure.

As used herein, the term "graphite-based structure" and "graphene device topography" refers to a structure having at least one graphene layer on at least one surface of the structure. The terms "graphite-based structure" and "graphene device topography" are interchangeable in the present disclosure.

As used herein, the term "element" refers to a feature configured or generated on a substrate. In general, at least a portion of the element is on or above the substrate. The element can be of any shape, size, or orientation. Exemplary elements include ribs, ribbons, pillars, mesas, geometries that produce or promote plasmonic effects, or other configurations. "Rib" or "ribbon" herein refers to a feature having a width smaller than a length. In some embodiments, "rib" and "ribbon" are interchangeable. "Pillar" herein refers to substantially circular, ovoid, regular or irregular features. "Mesa" herein refers to an island isolated from other features on the substrate or a plateau on the substrate. In general, a mesa has at least one dimension that is relatively large and thus can be used as a base for further processing of more complex structures. In some embodiments, a mesa has a topographical height feature, providing a capability for vertical isolation and/or size for desired functionality.

As used herein, the term "trench" refers to a space that separates two adjacent elements. It can be a recess formed in the substrate such as by etching, a space on or above the substrate formed for example by depositing two adjacent elements on or above the substrate, or a combination thereof. A trench can be of any shape or size as long as it separates two adjacent elements. In some embodiments, it is deep and/or has a width smaller than length.

As used herein, the term "orthogonal projection onto a common plane" and similar phrases means to project an image of a surface onto a plane without enlarging the source feature that is being projected. Thus, the dimensions of the contours of the surface (where here the feature being projected is the surface), when projected onto a common plane exactly match the actual dimensions of the surface that is projected. The construct of "orthogonal projection onto a common plane" has utility when two or more surfaces, which may be spatially separated on a z-axis, are projected along the z-axis onto a common plane. Such a projection is useful for illustrating whether the two projected surfaces are contiguous or overlapping.

5.2. Graphene Device Topography and Fabrication Methods

FIG. 6 illustrates a flowchart of an exemplary method 600 for defining a topography or forming a graphite-based structure on a substrate in accordance with an embodiment of the present disclosure. As shown, the exemplary method 600 of the present disclosure essentially includes a step S10 for patterning the substrate to define graphene device topography or form a desired structure and a step S20 for generating or growing graphene layers on selected surfaces of the defined topography or the patterned structure. The generation or growth of any graphene layers is conducted subsequently to patterning the substrate, thereby producing separated graphene layers on selected surfaces and thus eliminating additional processes for separating the graphene layers as required by most convention methods. As discussed above, graphene can be difficult to process because maintaining selectivity when etching carbon based materials is difficult in relation to other materials. Accordingly, the present application provides improved fabrication methods that are easier to use. Such methods are particularly advantageous in fabrication of complex structures or composite structures to achieve desired functionalities. In addition, exemplary methods of the present application reduce or eliminate loss of surface areas that typically occur in conventional methods during isolation of graphene layers after graphene generation, thus improving functionalities or efficiency of the generated graphite structures or devices.

Figure 2:
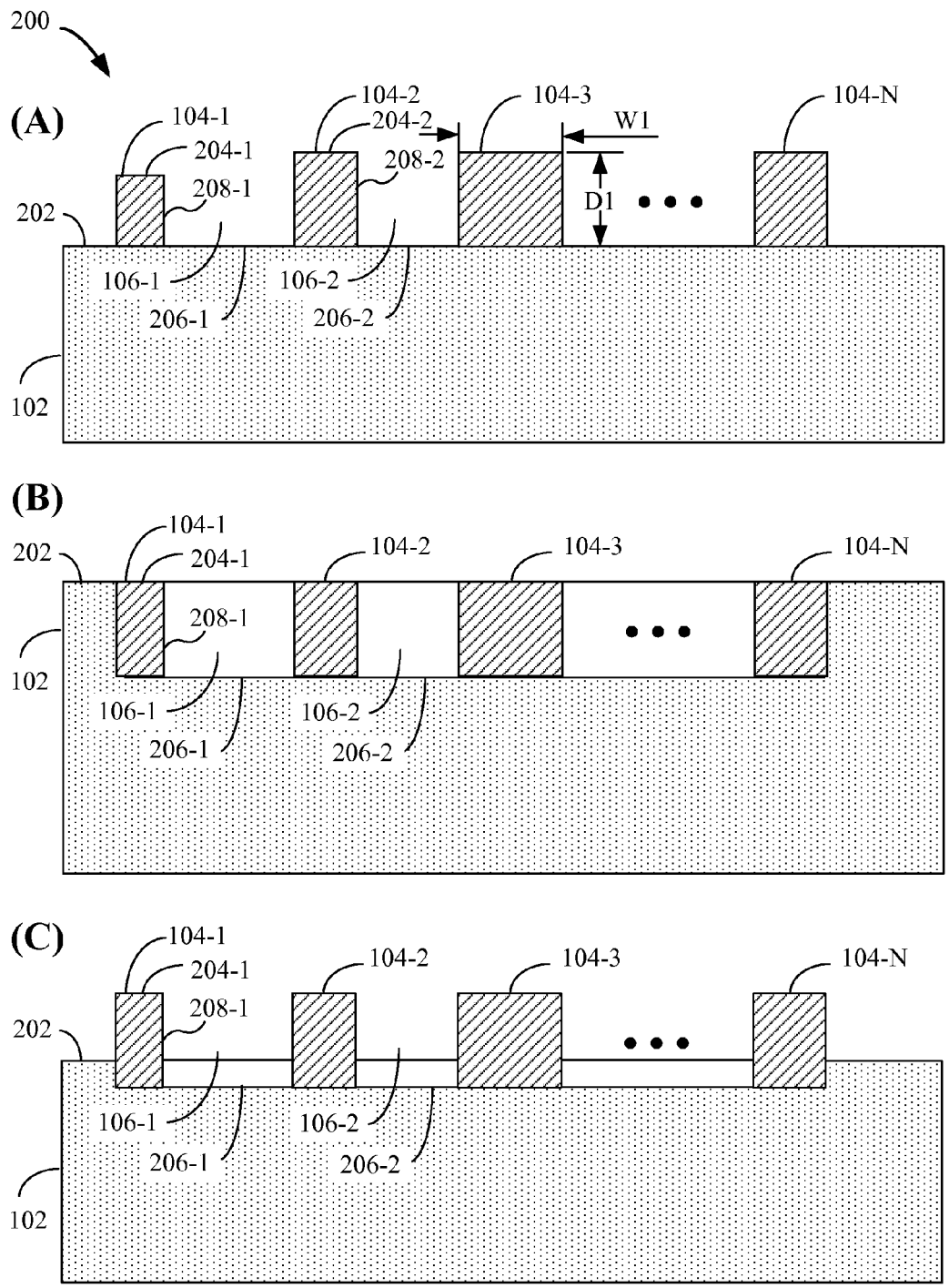
FIG. 2A illustrates a cross-sectional view of the exemplary graphene device topography taken along line 2-2' of FIG. 1 and fabricated by an exemplary method in accordance with an embodiment of the present disclosure.
FIG. 2B illustrates a cross-sectional view of the exemplary graphene device topography taken along line 2-2' of FIG. 1 and fabricated by another exemplary method in accordance with an embodiment of the present disclosure.

Exemplary topography or structures fabricated by exemplary methods of the present application are shown in FIGS. 1-5, 8-10, and 12-13. For example, FIG. 1 illustrates a top view of an exemplary graphite-based structure 100 fabricated by exemplary methods of the present disclosure, and FIG. 2 illustrates cross-sectional views of the exemplary graphite-based structure 100 taken along line 2-2' in FIG. 1. As shown, the exemplary graphite-based structure 100 includes a plurality of elements such as 104-1, 104-2 and a plurality of trenches such as 106-1, 106-2 formed on a substrate 102. Each respective element in the plurality of the elements is separated from an adjacent element on the substrate by a corresponding trench in a plurality of trenches in the substrate. For example, element 104-1 is separated by trench 106-1 from element 104-2, which in turn is separated from element 104-3 by trench 106-2.

An element in the plurality of the elements has a first surface and a side wall. For example, referring to FIG. 2A, element 104-1 has a first surface 204-1 and a side wall 208-1 and element 104-2 has a first surface 204-2 and a side wall 208-2. A trench in the plurality of trenches has a second surface, for example, trench 106-1 has a second surface 206-1 and trench 106-2 has a second surface 206-2.

In various embodiments, the first surface of an element is located at the top of the respective element and the second surface of a corresponding trench is located at the bottom of the corresponding trench. In various embodiments, the first surface of the respective element is characterized by a first elevation, and the second surface of the corresponding trench is characterized by a second elevation that is different than the first elevation. The first surface of the respective element is separated from the second surface of the corresponding trench by a side wall of the respective element. For example, the first surface 204-1 of element 104-1 is separated from the second surface 206-1 of trench 106-1 by side wall 208-1 of element 104-1.

By way of illustration, first surfaces of elements and second surfaces of trenches in FIG. 2 are flat and horizontal. One of skill in the art will appreciate, however, that the first surface of an element or the second surface of a trench does not necessarily need to be flat or horizontal. In some embodiments, the first surface of an element or the second surface of a trench has a slope or an arcuate property. In such embodiments, the first elevation or the second elevation is deemed by the average elevation, or some other measure of central tendency, of the first surface or the second surface, respectively.

In some embodiments, a graphite-based structure of the present disclosure includes a plurality of identical elements or a plurality of identical trenches. In some embodiments, a graphite-based structure of the present disclosure includes an element that has a different physical dimension (e.g. width) than another element in the plurality of elements or includes a trench that has a different physical dimension (e.g. width) than another trench in the plurality of trenches. For example, FIG. 2A shows an element 104-1 separated from a taller and wider element 104-2 by a wider trench 106-1, and a relatively larger and taller element 104-3 separated from element 104-2 by a narrower trench 106-2. One of skill in the art will appreciate that the difference between elements or trenches can manifest in other physical parameters and all such differences are within the scope of the present disclosure.

By way of illustration, FIGS. 1-2 show elements having a rib or ribbon-like shape. One of skill in the art will appreciate that exemplary methods of the present disclosure can be used to fabricate devices and/or structures with any of a variety of configurations, including devices with different shapes, sizes, number of elements, and orientation of elements. For instance, as shown in FIGS. 5A-5C, a structure fabricated by exemplary methods of the present disclosure can include a pillar-like or mesa-like element having a substantially circular, ovoid or polygonal shape. A structure can also include a combination of a rib-like element, a pillar-like element, a mesa-like element, or other elements. Similarly, a structure fabricated by exemplary methods of the present disclosure can include trenches having different shapes or sizes. Trenches can also be configured to separate adjacent elements in a row, in a column, or in any other orientation if desired.

In some embodiments, the orthogonal projection of a rib-like element on a common plane has a length and a width, with the length is between two times and five times of the width or at least two times of the width. In some embodiments, a rib-like element has a length up to 10 mm, up to 100 mm, up to 1 cm, up to 5 cm or up to 10 cm. In some embodiments, a rib-like element spans the entire substrate. In some embodiments, the width of the rib-like is between 1 nm and 10 nm, between 10 nm and 20 nm, between 20 nm and 30 nm, between 30 nm and 40 nm, between 40 nm and 50 nm, between 50 nm and 100 nm, or between 100 nm and 500 nm. In some embodiments, the orthogonal projection of a mesa-like element on a common plane has a size in any dimension that is between 10 nm and 100 nm, between 100 nm and 1 μm, or between 1 μm and 10 μm. In some embodiments, the orthogonal projection of a pillar-like element on a common plane is substantially circular, ovoid, or polygonal. Exemplary materials for substrate 102 are disclosed in Section 5.4.

In various embodiments, the substrate is patterned to form a plurality of elements on the substrate. This process is performed in step S10 of the exemplary method 600 depicted in FIG. 6. Each respective element in the plurality of elements is separated from an adjacent element on the substrate by a corresponding trench in a plurality of trenches in the substrate. Patterning the substrate can be achieved using any standard lithography technique including, but not limited to various deposition methods and etching methods. Exemplary deposition techniques include wet etching, plasma etching, ion beam etching, reactive ion etching, sputtering and evaporation, atomic layer deposition, catalytic deposition. More details regarding these deposition techniques are disclosed in more detail in Section 6 below. Exemplary etching methods are disclosed in Section 7 below. In some embodiments, patterning the substrate also involves one or more generic lithographic processes such as substrate preparation, photoresist application, softbake, exposure of photoresist, post exposure bake, photoresist development, hard back. Details and purposes of these processes are described in Section 7, and are also described, for example, in Van Zant, Microchip Fabrication, Forth Edition, McGraw-Hill, New York, 2000, which is hereby incorporated by reference herein in its entirety.

In some embodiments, patterning the substrate is achieved by depositing an element or a plurality of elements on the substrate, using one or more methods described in Section 6. For example, FIG. 2A illustrates patterning the substrate 102 by depositing a plurality of elements 104-4-1, 104-2, . . . , 104-N on surface 202 of the substrate 102. A trench is formed after deposition of any two adjacent elements, such as trench 106-1 formed by the deposition of element 104-1 and element 104-2. Generally, the surfaces 206 of trenches 106 formed by deposition of elements 104 are essentially at the same elevation as the surface 202 of the substrate 102.

In some embodiments, patterning the substrate 102 is achieved by etching a trench or trenches in the substrate using one or more methods described in Section 7. This process is depicted in FIG. 2B. As shown, element 104-2 is formed by etching trench 106-1 and trench 106-2 and is separated from element 104-1 and element 104-3 by trench 106-1 and trench 106-2, respectively. Unlike patterning the substrate by deposition of elements, the second surfaces of trenches formed by etching are in general located within the substrate and below the surface 202 of the substrate 102. However, the surfaces 104 of elements formed by etching trenches in the substrate are essentially at the same elevation as the surface 202 of the substrate 102.

In some embodiments, patterning the substrate is achieved by a combination of deposition and etching in the substrate, as depicted in FIG. 2C. As shown, element 104-2 includes a lower portion formed by etching and an upper portion formed by deposition. Such an element can be fabricated either by first etching the substrate to form the lower portion of the element and then depositing the upper portion on the lower portion of the element, or by depositing the upper portion on the substrate and then etching the substrate to form the lower portion of the element. A trench in such embodiments is a space established collectively by both the lower and upper portions of the two adjacent elements. In various embodiments, patterning the substrate by a combination of deposition and etching in the substrate produces neither the surfaces of elements nor the surfaces of trenches at the same elevation as of the surface 202 of the substrate 102. In general, the surfaces 204 of elements are above the surface 202 of the substrate 102 and the surfaces 206 of trenches are below the surface 202 of the substrate 102, respectively, as depicted in FIG. 2C.

One of skill in the art will appreciate that the surfaces of elements or the surfaces of trenches are readily modifiable by additional or alternative processes, thus providing the surfaces of elements or the surfaces of trenches with different elevations, shapes, sizes or orientations. However, regardless of the processes used for patterning the substrate, the surface of a respective element and the surface of the corresponding trench are spatially separated by the first side wall, and/or the elevation of the surface of the element is different than the elevation of the surface of the corresponding trench. In some embodiments, the difference between these elevations equals the height of the first side wall, as indicated by "D1" in FIG. 2A. Moreover, in various embodiments, orthogonal projections of the surface of the element and the surface of a corresponding adjacent trench onto a common plane are contiguous or overlapping. For example, FIG. 3 depicts an exemplary embodiment 300 in which projections of the surface 204-1 of element 104-1 and the surface 206-1 of the corresponding adjacent trench 106-1 onto a common plane is continuous.

FIGS. 4A and 4B depict an exemplary embodiment 400 in which orthogonal projections of the surface 204-1 of element 104-1 and the surface 206-1 of the corresponding adjacent trench 106 onto a common plane are overlapping. As such, as can be seen in FIG. 4A, this results in a functional graphene surface that is larger than the physical surface area of the underlying substrate before the processing was initiated. In some embodiments, the functional graphene surface is more than ten percent larger than the physical surface area of the underlying substrate before the processing was initiated. In some embodiments, the functional graphene surface is more than fifteen percent, more than twenty percent, more than twenty-five percent, more than thirty percent, or more than forty percent larger than the physical surface area of the underlying substrate before the processing was initiated.

Embodiments with overlapping projections can be achieved, for example, by any standard etching processes that undercut a topographical feature. Examples of such etching processes include re-entry etching a side wall of an element, as depicted in FIGS. 4A and 4B, thereby tapering the element to form an upside down wedge. In some embodiments, re-entry etching is conducted on one side wall of an element. In some embodiments, re-entry etching is conducted on both side walls of an element with either the same or different reentrant angles α.

Embodiments with overlapping projections provide additional surface area for growing isolated graphene layers. The obtained additional surface area is a function of the reentrant angle, dimensions of the element and the corresponding trench. For example, the exemplary embodiment depicted in FIG. 4B provides the combination of the first surface and the second surface that equals W1+W2. Prior to the patterning, the surface area of the corresponding portion of the substrate is equivalent to W1+W3. Thus, the additional surface area obtained by such re-entry etching can be written as:

$$W2 - W3 = 2 \times D1 \times \tan \alpha \qquad \text{Eq. (1)}$$

where α is the reentrant angle. The increase in the surface area can also be expressed as the following, with γ indicating the ratio of the increase:

$$\gamma = \frac{W1 + W2}{W1 + W3} = 1 + \frac{2 \times D1 \times \tan\alpha}{W1 + W3}. \qquad \text{Eq. (2)}$$

In some cases, W1+W3 is referred to as the pitch of the topography. In some embodiments, the ratio γ is between 1 to 1.9. Depending on the applications and desired functionalities, in some embodiments, the ratio γ can have a value that is higher than 1.9.

After the substrate is patterned, graphene layers are generated on selected surfaces in step S20 of the exemplary method 600 as depicted in FIG. 6. For example, FIG. 3 illustrates generation of graphene layers such as 302-1, 302-2 on the surfaces 204 of the elements and graphene layers such as 304-1, 304-2 on the surfaces 206 of the trenches. In some embodiments, the generation of graphene layers on the surfaces 204 and the surfaces 206 are concurrent. In various embodiments, the first graphene layer 302-1 is generated on the entire surface 204-1 and the second graphene layer 304-1 generated on the entire surface 206-1. The second graphene layer 304-1 has a thickness, indicated by "D2" in FIG. 3, that is less than the difference between the first elevation of the surface 204-1 and the second elevation of the surface 206-1, thereby creating the graphite-based structure in which the second graphene layer 304-1 is isolated from the first graphene layer 302-1.

To further illustrate some embodiments having a functional graphene surface that is larger than the physical surface area of the underlying substrate before the processing was initiated, FIG. 17 illustrates an exemplary orthogonal projection of the embodiment 400 onto a common plane, e.g., plane 1702. While the graphene layer 302-1 and the graphene layer 304-1 are spatially separated by the side wall 208-1 on z-axis, the orthogonal projections of these two graphene layers onto the plane 1702 are overlapping. Similarly, the graphene layer 302-2 and the graphene layer 304-1 are spatially separated but their orthogonal projections onto the plain 1702 are overlapping. As a result, such embodiments provide additional workable surface areas for enhancing functionality of devices. It is to be noted that the orthogonal projections of these layers onto the common plane 1702 have the same dimensions as their corresponding physical layers.

Generation of graphene layers on selected surfaces of a defined topography can be achieved by various methods defined in the art. Selection of a suitable method depends on the substrate material, the desired thickness of the graphene layers or other factors. For example, reverse epitaxial growth methods can be used for generating graphene layers on surfaces comprising silicon carbide or silicon implanted with carbon. The basic epitaxial growth process involves heating the substrate, after patterning, to elevated temperatures, for example 900° C. to 1300° C. or in some case to 1700° C., in a vacuum or in a controlled inert environment, to spur the growth of graphene.

When heated to elevated temperatures, in some embodiments, thermal decomposition occurs in the substrate. Silicon migrates to the surface and evaporates, leaving carbon at or near the surface for epitaxial growth of graphene. Controlling parameters for graphene growth include pressure, temperature, and processing time. In some embodiments, substrate heating is performed in a furnace with quenching, or by rapid thermal annealing with a pulsed source.

If selected surfaces of the topography comprise metallic materials such as copper, nickel, iridium, or cobalt, chemical vapor deposition (CVD) techniques can be used for graphene growth. CVD techniques make use of a high temperature furnace to deposit atoms on the substrate or on selected surfaces of the substrate. More information on graphene growth techniques that can be used in accordance with the present disclosure can be found, for example, in "Graphene Growth Techniques for Use in Nanoelectronics," last accessed on Dec. 6, 2012 from cerc.utexas.edu/~kparrish/class/Graphene_Synthesis.pdf, and in "Temperature Dependent Growth Properties of Epitaxial Graphene on Carbon-Face Silicon Carbide," pp 98-99, 2010 NNIN REU Research Accomplishments, each is which is hereby incorporated by dereference.

Turning now to FIG. 7, there is depicted a flowchart of an alternative exemplary method 700 in accordance with the present disclosure that includes additional, optional, or alternative processes. For example, exemplary method 700 includes an additional or optional step S30 for selectively doping selected surface or surfaces with carbon to form a carbide layer near the selected surface or surfaces. In various embodiments, step S30 is conducted subsequently to the patterning S10 but prior to the concurrently generating of graphene layers S20. Step S30 can be achieved by various methods including ion implantation and chemical vapor deposition. The substrate used for this process can be made of silicon or germanium, or other materials such as compound semiconductors, oxides, nitrides, carbides, metals or metal alloy.

As an example, FIG. 8 illustrates doping a defined topography with carbon using an ion implantation method. Ion implantation is a materials engineering process that can be used to change the physical, chemical, or electrical properties of the target such as the substrate 102. During ion implantation, ions (e.g., charged atoms or molecules) are created via an enormous electric field stripping away an electron. These ions are filtered and accelerated toward the target, and buried in the target. The depth of the implantation depends on the acceleration energy (e.g., voltage). The ions alter the elemental composition of the target if the ions differ in composition from the target. They can also change physical, chemical or electrical properties of the target by transferring their energy and momentum to the electrons and atomic nuclei of the target material. For example, they can change the crystal structure of the target by the energetic collision cascades.

As shown in FIG. 8A, directional ion implantation with carbon is performed on an exemplary patterned structure having a plurality of elements such as 104-1, 104-2 and trenches such as 106-1, 106-2. Such directional ion implantation produces carbide layers in the substrate 102 within the surfaces 204 of the elements 104 and within the surfaces 206 of the trenches 106. For example, a carbide layer 802-1 is produced at or near the surface 204-1 of the element 104-1 and a carbide layer 804-1 is produced at or near the surface 206-1 of the trench 106-1, as shown in FIG. 8B. In some embodiments, doping the substrate with carbon comprises ion implantation to the entire surface 204-1 of the element 104-1 or the entire surface 206-1 of the trench 106-1 with elemental carbon.

In various embodiments, the ion implantation is performed with a dose between $10^8$ ions/cm$^2$ and $10^{21}$ ions/cm$^2$, and an energy between 5 KeV and 400 KeV. By controlling the implantation dose or energy, the ion implantation controls the carbon penetration into the selected surfaces, thus controlling the carbon concentration or profile at or near the selected surfaces. As a result, the ion implantation provides an accurate control of the thickness of the subsequently generated graphene layers. For example, the thickness of the graphene layer 304-1 is controlled to be less than the height of the side wall 208-1 to ensure that graphene layers 304-1 and layer 302-1 are separated from each other. In some embodiments, a carbide layer after ion implantation has a depth that is between 1 nm and 2 nm, between 2 nm and 10 nm, between 10 nm and 100 nm, between 100 nm and 1 μm, or between 1 μm and 5 μm.

In some embodiments, the exemplary method 700 of FIG. 7 also includes an additional or optional step S40, in which a selected surface or surfaces of the topography are passivated. The passivation step S40 is performed prior to the graphene generation to ensure such passivated surfaces are inhibited from graphene growth during the subsequent graphene generation step S20. This process is useful in fabricating graphene device topography with isolated and distinct graphene layers. In particular, it is useful when the substrate is made of SiC or some other materials including metals or catalyst materials such as copper and nickel, since graphene would grow on all surfaces comprising SiC without passivation.

The passivation step S40 can be conducted either before or after the doping step S30 as long as it is conducted prior to the graphene generation step S20. Preferably, the passivation step S40 is conducted after the doping step S30, if both steps are employed in fabricating graphite-based structures or devices.

Various methods, including standard lithographic deposition methods and oxidation methods, can be used to passivate a selected surface or surfaces on the patterned structures. By way of illustration, FIG. 9 depicts an exemplary passivation method 900 that deposits a protection layer, such as by Atomic Layer Deposition (ALD) method, to inhibit graphene growth on side walls. As shown in FIG. 9A, a protection layer is deposited on a selected surface, such as a protection layer 902-1 deposited on a side wall 208-1 of the element 104-1 and a protection layer 902-2 deposited on a side wall 208-2 of the element 104-2.

Materials suitable for forming the protection layer include, but not limited to, $SiO_2$, SiN, or $Si_3N_4$. SiN or $Si_3N_4$ may be preferable in some embodiments when reverse epitaxial graphene generation is performed at relatively higher temperatures, because they are in general more stable during the epitaxial process.

Typically, a protection layer having a thickness of about 1 to 3 nm is deposited on a selected surface for inhibition of graphene growth. In some embodiments, ALD is used to deposit a protection layer with a thinner thickness. In some embodiments, the ALD deposition process is repeated to achieve a relative greater thickness if desired.

After the deposition of the protection layer, graphene generation is then performed as shown in FIG. 9B. Since the side walls, such as side walls 208-1 and 208-2, are protected by the protection layers, such as protection layers 902-1 and 902-2, graphene growth on these protected side walls is inhibited during graphene generation step. Consequently, the graphene layer 302-1 generated on the surface 204-1 of the element 104-1 is isolated from the graphene layer 304-1 generated on the surface 206-1 of the trench 106-1. Similarly, the graphene layer 302-2 generated on the surface 204-2 of the element 104-2 is isolated from the graphene layer 304-1 generated on the surface 206-1 of the trench 106-1.

In some embodiments, other materials are deposited on selected surfaces to achieve other desired functionalities. For example, a metallic material such as Cu, Ti, Ni, or Pd can be deposited on the selected surfaces such as side walls 208-1 and 208-2. In some embodiments, where the elements or trenches comprise an initial metallic material, the metallic material selected for depositing on side walls is less reactive than the initial metallic material, and/or process parameters are set to enhance one reaction over another. In addition to protecting the selected surface from graphene generation, the metallic layer such as 902-1, 902-2 after graphene growth can be integrated as a metal lead or interconnect. For example, graphene layer 304-1 generated on the surface 206-1 is in contact with the metal layer 902-1 at one side 906-1 and in contact with the metal layer 902-2 at the other side 906-2, as shown in FIG. 9B. One of skill in the art will appreciate that the graphene layers can be connected or accessed in various ways, jointly or independently depending on the desired applications.

In some embodiments, a plurality of layers is deposited on the selected surfaces to achieve desired functionalities. For example, ALD can be used to successively deposit alternating layers of $SiO_2$ and SiN in order to achieve a desired thickness or inertness requirement. Additional materials can also be deposited between the silicon based compounds to act as heat barriers. By way of illustration, FIG. 9C depicts the deposition of two layers on side walls. The first layer 902-1 is overlaid on the side wall 208-1 and the second layer 904-1 overlaid over the first layer 902-1. By the same token, the first layer 902-2 is overlaid on the side wall 208-2 and the second layer 904-2 overlaid on the first layer 902-2. The first and second layers comprise different materials. One of skill in the art will appreciate that a protection layer deposited on one surface is not necessary the same as that deposited on another surface. Depending on the applications and desired functionalities, protection layers deposited on different surfaces can be different, in terms of the number of layers, the thickness of each layer, or the material used for each layer.

FIG. 10 illustrates another exemplary passivation method 1000 that employs oxidation processes. The oxidation is performed on a defined topography or structure after the substrate is patterned in step S10. Since oxidation is in general a conformal process, the full structure would be encapsulated by a thin and essentially uniform oxide layer. As an example, FIG. 10A depicts oxidation performed on a patterned structure having a plurality of elements and trenches. The oxidation layer, indicated by layer 1002, encapsulates the entire structure including the surface 204-1 and side wall 208-1 of the element 104-1 and the surface 206-1 of the trench 106-1.

In some embodiments, the patterned structure is oxidized by a controlled high density dry oxidation process to grow about 5 nm to 10 nm of oxide or, more generally, 2 nm to 20 nm of oxide. For a silicon based substrate, this oxide 1002 is predominantly $SiO_2$. For more information on thermal oxidation of silicon carbide, see, e.g., "On Silicon Carbide Thermal Oxidation," African Physical Review (2010) 4:0005, which is hereby incorporated by reference herein in its entirety.

After the oxidation, a removal process such as an anisotropic or a directional etching process is performed to remove the oxidation layer from surfaces where graphene growth is desired. In the exemplary embodiment depicted in FIG. 10B, the oxidation layers grown on the surfaces of the elements, such as surfaces 204-1 and 204-2, and on the surfaces of the trenches, such as surfaces 206-1 and 206-2, are removed. Because the etching is directional, the oxidation layers grown on the side walls, such as layers 1004-1 and 1004-2, or at least a sub-layer (portion) of it, remains, thereby inhibiting graphene growth on side walls in the subsequent generation process. This process is shown in FIG. 10C. Similar to the protection layer 902-1, 902-2, the remaining oxidation layers 1004-1, 1004-2 separate the graphene layer 302-1 from the graphene layer 304-1 and the graphene layer 302-2 from the graphene layer 304-2.

Referring now to FIG. 11, there is depicted a flowchart of another exemplary method 1100 in accordance with the present disclosure. The exemplary method 1100 includes an additional or optional step S50, in which the substrate is selectively doped with a dopant for fabrication of a graphene layer having a charge carrier or selectively doped with two or more different dopants for fabrication of a graphene layer having a junction. The selected graphene layer can be generated on any surface in a defined topography, including surfaces of elements or trenches.

The doping step S50 can be conducted either prior to or after graphene growth. In general, doping the substrate with a dopant is conducted either prior to or after the graphene generation when the substrate comprises a semiconducting material, and is conducted after the graphene generation when the substrate comprises a dielectric material or a metallic material. Various methods can be used for doping the substrate, including ion implantation.

Suitable dopants for use in doping step S50 include, but are not limited to, acceptors that produce a p-type doping or donors that produce an n-type doping. Examples of such dopants include phosphorous, arsenic, selenium, tellurium, silicon, germanium, boron, aluminum, beryllium, zinc, antimony, and carbon.

The doping step S50 can also be conducted in combination with other additional or optional processes or steps, such as the processes or steps S30 and S40 shown in FIG. 11. One of skill in the art will appreciate that the order of performing these processes or steps shown in FIG. 11 is illustrative. Depending on the application, the substrate materials, or other factors, the additional or optional processes employed and the order of performing such processes can be readily varied.

By way of illustration, FIG. 12 depicts a process for doping the substrate after the graphene generation. As shown in FIG. 12B, the graphene layer 302-1 is doped with a first dopant, for example by ion implantation, thereby forming a first doped sub-layer 1202 within the graphene layer 302-1. The resultant first doped sub-layer has a first charge carrier, which can be either electrons or holes depending on the substrate and the first dopant. In some embodiments, the first doped sub-layer 1202 is located at or near the bottom of the graphene layer 302-1, which can be achieved, for example, using ion implantation with higher energy. In some embodiments, doping and graphene generation is alternated or repeated. For example, a graphene generation process is conducted, which is followed by a doping process. Then another graphene generation process is conducted and followed by another doping process, and so forth.

In some embodiments, after the first doped sub-layer 1202 is formed within the graphene layer 302-1, the graphene layer 302-1 is doped with a second dopant to form a second doped sub-layer within the graphene layer 302-1. These processes are illustrated in FIGS. 12C and 12D). In various embodiments, the second dopant is different than the first dopant, providing the second doped sub-layer 1204 with a second charge carrier having opposite chargers to the first charger carrier. As a result, the first and second doped sub-layers form a PN or NP junction within the graphene layer. In some embodiments, the graphene is doped with one or more dopants such that dopants form a gradient. For instance, in some embodiments, the concentration of a dopant increases or decreases as a function of depth. In one example, a given dopant increases in concentration as a function of distance away from the upper (exposed) surface of the graphene layer.

Doping the substrate with the first dopant and with the second dopant can be performed concurrently or sequentially. If performed sequentially, the resultant second doped sub-layer 1204 is preferably formed above the first doped sub-layer 1202 or overlayed on the first doped sub-layer 1202. One of skill in the art will appreciate, however, that the second doped sub-layer 1204 can be formed below the first doped sub-layer 1202, for example, by varying the processing parameters or selecting different processing methods.

In various embodiments, the graphene layer 302-1 is further doped with a third dopant to form a third doped sub-layer, either above the second doped sub-layer 1204 or below the first doped sub-layer 1202. Collectively, the first, second and third doped sub-layers form a PNP or NPN junction.

Substrate doping can also be performed on one or more portions of a selected graphene layer. For example, FIG. 13 illustrates an exemplary embodiment 1300, corresponding to a cross-sectional view of the exemplary graphite-based structure 100 taken along line 13-13' in FIG. 1. As shown in FIG. 13A, the graphene layer 302-3 generated on the surface 204-3 of the element 104-3 is doped at a first portion 1302 with a first dopant and at an adjacent second portion 1304 with a second dopant. The first portion 1302 has the first charge carrier and the second portion 1304 has the second charge carrier, thereby creating a PN or NP junction between the first portion 1302 and the second portion 1304 of the graphene layer 302-3.

In some embodiments, the graphene layer 302-3 is further doped with a third dopant at a third portion either adjacent to the first portion or the second portion. FIG. 13B depicts the third portion 1306 adjacent to the second portion 1304 as an example. The third portion 1306 has the first carriers as the first portion 1302, thereby the first portion 1302, the second portion 1304, and the third portion 1306 collectively creating a PNP or NPN bipolar junction in the graphene layer 302-3.

Depending on the applications or desired functionalities, two or more graphene layers in a defined topography can be doped in essentially the same way or differently, in terms of dopants, dopant concentrations, doping sites, or other factors. For example, in some embodiments, one graphene layer is doped to form doped sub-layers in a manner as depicted in FIG. 12 whereas another graphene layer in the same topography is doped at a portion of it in a manner as depicted in FIG. 13. In some embodiments, the substrate is doped in a manner such that one or more doped sub-layers are formed in all or a portion of a graphene layer.

Doped graphene layers can be formed either on the elements or on the trenches, or in various combinations thereof. Further, doping can also be performed to form a doped region or area within the elements or within the substrate. The individual doped graphene layers, doped elements, and doped substrate, and various combinations thereof, provide various useful functions and serve as diodes, transistors, LEDs, solar cells, photodetectors, or other graphene devices.

As an example, FIG. 14 illustrates an embodiment 1400 which is further doped with, for example, two different dopants at several additional locations other than the graphene layer 302-1 on the top of the element 104-1. Doping is performed, either prior to or after graphene generation, such that the graphene layer 304-1 at the trench 106-1 is generated with a doped sub-layer 1402. In some embodiments, the doped sub-layer 1402 has the same first dopant as of the doped sub-layer 1202, and in some embodiments it acts as a resister bar. In some embodiments, doping is performed such that the graphene layer on the left side of the element 104-1 also includes a doped sub-layer 1404. In some embodiments, the doped sub-layer 1404 has the same dopant as of the doped sub-layer 1204, and can serve as a connector that connects the graphene layers to the substrate 102. Further in some embodiments, doping is performed on or within the substrate 102. For example, doping is performed such as a doped region 1406 is formed in the substrate. In some embodiments, this doped area 1406 is formed using the same ion implantation with the same dose and energy as of the dosed-sub-layer 1202. In some embodiments, this doped area 1406 forms a contact for diode, transistor, Schottky or Ohmic lead.

FIG. 15 illustrates another exemplary embodiment 1500, in which the element 104-3 is doped to form a doped region 1502 within the element underneath of the PN or NP junction 1302, 1304 created in a portion of the graphene layer 302-3. In some embodiments, the dopant used for creating such a doped region 1502 is the same as the first dopant or the second dopant but with different doses, thereby producing the dosed region 1502 different than the first and second portions 1302, 1304, for example with P+ or P++ area. In some embodiments, the dopant used for creating such a doped region 1502 is different than the first dopant and the second dopant. For example, when boron or phosphorous is used as the first or second dopant for the first or second portion 1302, 1304, arsenic can be used as a dopant for the doped region 1502 within the element 104-3. The exemplary embodiment 1500 can be used as a transistor. A deeper doped region, for example to the substrate, can act as a ground tap, an interconnector, or an isolation feature that separates the graphene layers such as 302-3 from other features, depending on the substrate and the doping.

FIG. 16 illustrates yet another exemplary embodiment 1600, in which the element 104-3 is doped to form a doped region 1602 within the element underneath of the bipolar junction 1302, 1304, 1306 created in a portion of the graphene layer 302-3. Similar to the doped region 1502 described above, the dopant used for creating the doped region 1602 can be the same as the first, second, or third dopant but with different doses. Different dopants than the first, second, or third dopant can also be used for creating the doped region 1602. Exemplary embodiment 1600 can be used as a diode or a transistor. Further, exemplary embodiment 1600 is optionally doped at other locations, such as another doped region 1604 in the substrate 102. Depending on the substrate materials, the dopant used or other factors, this doped region 1604 can form ohmic or non-ohmic contact with the graphene layers. In some embodiments, it forms a Schottky barrier with the graphene layers. In some embodiments, the doped portion 1306, the doped region 1604 and the graphene layer in between are electrically wired and form an integral feature.

5.3. Advantages

There are many advantages to fabricating graphene device topography in the manner described above. One advantage is ease of fabrication. Currently, patterning graphene sheets into desired shapes is a difficult task, due to the novelty of graphene and the techniques of etching the same. However, patterning other materials, for example, dielectric, semiconducting or metallic materials, to form a desired topography is a much more mature technology and can be achieved with much more ease.

Another advantage of the methods described in the present disclosure is the ability to produce structures and devices with high packing densities. Through isolation by vertical topographical differences, the methods of the present disclosure eliminate the loss of surface areas that generally occurs in conventional horizontal isolation methods. Moreover, the methods of the present disclosure can produce structures and devices with workable surface areas that surpass the physical surface areas, thus increasing the packing density. For example, the methods of the present disclosure can produce desired structures with graphene layers that are isolated yet continuous or overlapping when orthogonally projected on a common plane. Such structures have functional surface areas larger than their underlying physical surface areas on the substrate, providing additional workable surface areas for absorbing or emitting photons thereby enhancing functionalities of devices such as efficiency of solar cells or photodetectors.

Another advantage of the methods described in the present disclosure is the ability to produce desired structures with precision. Current methods of patterning graphene sheets into desired shapes yield unpredictable shapes and erratic edge structures due to the isolation void or oxidation. Because the methods described above generate isolated graphene layers on a patterned substrate, other than patterning the graphene sheets, the exact structures and patterns desired can be produced more consistently and precisely.

Still another advantage of the methods described in the present disclosure is the ability to produce complex or composite structures. For example, the methods described in the present disclosure can produce structures and devices with different geometric features with each feature or a subgroup of features targeting a specific functionality.

5.4. Exemplary Substrates

As used herein, the term "substrate" refers to a solid substance generally in a form of a thin slice. The substrate can be planar or flexible, and can comprise dielectric, semiconducting or metallic materials, such as glass, Si, $SiO_2$, SiC, Cu, Ni, or other materials, or combinations of such materials.

Exemplary dielectric materials include, but are not limited to, glass, silicon dioxide, neoceram, and sapphire.

Exemplary semiconducting materials include, but are not limited to, silicon (Si), silicon carbide (SiC), germanium (Ge), boron nitride (BN), and molybdenum sulfide (MoS).

Exemplary metallic materials comprise copper (Cu), nickel (Ni), platinum (Pt), gold (Au), cobalt (Co), ruthenium (Ru), palladium (Pd), titanium (Ti), silver (Ag), aluminum (Al), cadmium (Cd), iridium (Ir), combinations thereof, and alloys thereof.

In some embodiments the substrate comprises a metal foil or a metal slug.

In some embodiments the substrate comprises Si, $SiO_2$, SiC, Cu, Ni, or other materials. In some embodiments, the substrate substantially comprises neoceram, barosilicate glass, germanium arsenide, a IV-V semiconductor material, a substantially metallic material, a high temperature glass, or a combination thereof.

In some embodiments, the substrate 102 is made of glass. Any of a wide variety of glasses can be used to make the substrate 102, some of which are described here. In some embodiments, the substrate 102 is made of silicon dioxide ($SiO_2$) glass. In some embodiments, the substrate 102 is made of soda lime glass formed from silicon dioxide, soda (e.g., sodium carbonate $Na_2CO_3$), or potash, a potassium compound, and lime (calcium oxide, CaO). In some embodiments, the substrate 102 is made of lead glass, such as lead crystal or flint glass. In some embodiments, silicon dioxide glass doped with boron, barium, thorium oxide, lanthanum oxide, iron, or cerium(V) oxide is used to make the substrate 102. In some embodiments, the substrate 102 is made of aluminosilicate, borosilicate (e.g., PYREX, DURAN®, SIMAX®, dichroic, germanium/semiconductor, glass ceramic, silicate/fused silica, soda lime, quartz, or chalcogenide/sulphide.

In some embodiments, the substrate is made of poly methyl methacrylate (PMMA), polyethylene terephthalate (PET), polyvinyl alcohol (PVA), or cellulose acetate (CA). In some embodiments, the substrate is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

In some embodiments, the substrate includes one layer. In alternative embodiments, the substrate includes a plurality of layers. In some embodiments, a substrate comprises a plurality of layers, each with a different material. In some embodiments, a layer of another substance is applied onto the substrate. In some embodiments, the substrate has crystallographic symmetry. In some embodiments the substrate is crystalline (e.g., mono-crystalline or polycrystalline).

6. Deposition Methods

The following subsections describe individual fabrication techniques that can be used to deposit material, e.g. element 104 and protection layer 902, 904, hereinafter referred to collectively as "deposit materials," in accordance with embodiments of the present disclosure.

6.1. Chemical Vapor Deposition

In some embodiments, one or more layers of the deposit materials are deposited by chemical vapor deposition. In chemical vapor deposition (CVD), the constituents of a vapor phase, often diluted with an inert carrier gas, react at a hot surface (typically higher than 190° C.) to deposit a solid film. Generally, chemical vapor deposition reactions require the addition of energy to the system, such as heating the chamber or the wafer. For more information on chemical vapor deposition, exemplary devices used to perform chemical vapor deposition, and process conditions are used to perform chemical vapor deposition of silicon nitride, see Van Zant, Microchip Fabrication, Fourth Edition, McGraw-Hill, New York, 2000, pp. 363-393; and Madou, Fundamentals of Microfabrication, Second Edition, 2002, pp. 144-154, CRC Press, each of which are hereby incorporated by reference herein in their entireties.

6.2. Reduced Pressure Chemical Vapor Deposition

In some embodiments, one or more layers of the deposit materials are deposited by reduced pressure chemical vapor deposition (RPCVD). RPCVD is typically performed at below 10 Pa and at temperatures in the range of (550° C.-600° C.). The low pressure used in RPCVD results in a large diffusion coefficient, which leads to growth of a layer that is limited by the rate of surface reactions rather than the rate of mass transfer to the substrate. In RPCVD, reactants can typically be used without dilution. RPCVD is performed, for example, in some embodiments, in a horizontal tube hot wall reactor.

6.3. Low Pressure Chemical Vapor Deposition

In some embodiments, one or more layers of the deposit materials are deposited by low pressure chemical vapor deposition (LPCVD) or very low pressure CVD. LPCVD is typically performed at below 1 Pa.

6.4. Atmospheric Chemical Vapor Deposition

In some embodiments, one or more layers of the deposit materials are deposited by atmospheric to slightly reduced pressure chemical vapor deposition. Atmospheric pressure to slightly reduced pressure CVD (APCVD) is used, for example, to grow APCVD is a relatively simplistic process that has the advantage of producing layers at high deposition rates and low temperatures (350° C.-400° C.).

6.5. Plasma Enhanced Chemical Vapor Deposition

In some embodiments, one or more layers of the deposit materials are deposited by plasma enhanced (plasma assisted) chemical vapor deposition (PECVD). PECVD systems feature a parallel plate chamber operated at a low pressure (e.g., 2-5 Torr) and low temperature (300° C.-400° C.). A radio-frequency-induced glow discharge, or other plasma source is used to induce a plasma field in the deposition gas. PECVD systems that are used include, but are not limited to, horizontal vertical flow PECVD, barrel radiant-heated PECVD, and horizontal-tube PECVD. In some embodiments, remote plasma CVD (RPCVD) is used. Remote plasma CVD is described, for example, in U.S. Pat. No. 6,458,715 to Sano et al., which is hereby incorporated by reference in its entirety.

6.6. Anodization

In some embodiments, one or more layers of the deposit materials are deposited by anodization. Anodization is an oxidation process performed in an electrolytic cell. The material to be anodized becomes the anode (+) while a noble metal is the cathode (−). Depending on the solubility of the anodic reaction products, an insoluble layer (e.g., an oxide) results. If the primary oxidizing agent is water, the resulting oxides generally are porous, whereas organic electrolytes lead to very dense oxides providing excellent passivation. See, e.g., Madou et al., 1982, J. Electrochem. Soc. 129, pp. 2749-2752, which is hereby incorporated by reference in its entirety.

6.7. Sol-Gel Deposition Techniques

In some embodiments, one or more layers of the deposit materials are deposited by a sol-gel process. In a sol-gel process solid particles, chemical precursors, in a colloidal suspension in a liquid (a sol) forms a gelatinous network (a gel). Upon removal of the solvent by heating a glass or ceramic layer. Both sol and gel formation are low-temperature processes. For sol formation, an appropriate chemical precursor is dissolved in a liquid, for example, tetraethylsiloxane (TEOS) in water. The sol is then brought to its gel-point, that is, the point in the phase diagram where the sol abruptly changes from a viscous liquid to a gelatinous, polymerized network. In the gel state the material is shaped (e.g., a fiber or a lens) or applied onto a substrate by spinning, dipping, or spraying. In the case of TEOS, a silica gel is formed by hydrolysis and condensation using hydrochloric acid as the catalyst. Drying and sintering at temperatures between 200° C. to 600° C. transforms the gel into a glass and ultimately into silicon dioxide.

in the semiconductor industry the sol-gel method described is often used to deposit silicon dioxide. The method is known as the Spin-On Glass method (SOG). Spin-On Glass materials have been widely used as a diffusion source or a pianarizing dielectric or multilevel metalisation schemes in the fabrication of nowadays integrated circuits. SOGs are in general Si—O network polymers in organic solvents, and prepared through the hydrolysis-condensation reaction that implied the sol-gel technology. SOG materials can be divided into three groups: 1) silicate based compounds, 2) organosilicon compounds and 3) dopant-organic compounds. More information on SOG can be found, for example, in Nguyen Nhu Toan, *Spin-On Glass Materials and Applications* in Advanced IC Technologies, 1999, which is hereby incorporated herein by reference in its entirety.

6.8. Plasma Spraying Techniques

In some embodiments, one or more layers of the deposit materials are deposited by a plasma spraying process. With plasma spraying, almost any material can be coated on many types of substrates. Plasma spraying is a particle deposition method. Particles, a few microns to 100 microns in diameter, are transported from source to substrate. In plasma spraying, a high-intensity plasma arc is operated between a sticktype cathode and a nozzle-shaped water-cooled anode. Plasma gas, pneumatically fed along the cathode, is heated by the arc to plasma temperatures, leaving the anode nozzle as a plasma jet or plasma flame. Argon and mixtures of argon with other noble (He) or molecular gases ($H_2$, $N_2$, $O_2$, etc.) are frequently used for plasma spraying. Fine powder suspended in a carrier gas is injected into the plasma jet where the particles are accelerated and heated. The plasma jet reaches temperatures of 20,000 K and velocities up to 1000 $ms^{-1}$ in some embodiments. The temperature of the particle surface is lower than the plasma temperature, and the dwelling time in the plasma gas is very short. The lower surface temperature and short duration prevent the spray particles from being vaporized in the gas plasma. The particles in the plasma assume a negative charge, owing to the different thermal velocities of electrons and ions. As the molten particles splatter with high velocities onto a substrate, they spread, freeze, and form a more or less dense coating, typically forming a good bond with the substrate. Plasma spraying equipment is available from Sulzer Metco (Winterthur Switzerland). For more information on plasma spraying, see, for example, Madou, *Fundamentals of Microfabrication*, Second Edition, 2002, pp. 157-159, CRC Press, which is hereby incorporated by reference in its entirety.

6.9. Ink Jet Printing

In some embodiments, one or more layers of the deposit materials are deposited by ink-jet printing. Ink-jet printing is based on the same principles of commercial ink-jet printing. The ink-jet nozzle is connected to a reservoir filled with the chemical solution and placed above a computer-control led x-y stage. The target object is placed on the x-y stage and, under computer control, liquid drops (e.g., 50 microns in diameter) are expelled through the nozzle onto a well-defined place on the object. Different nozzles print different spots in parallel. In one embodiment of the present disclosure, a bubble jet, with drops as small as a few picoliters, is used to form a layer of a deposit material. In another embodiment, a thermal ink jet (Hewlett Packard, Palo Alto, Calif.) is used to form a layer of a deposit material. In a thermal ink jet, resistors are used to rapidly heat a thin layer of liquid ink. A superheated vapor explosion vaporizes a tiny fraction of the ink to form an expanding bubble that ejects a drop of ink from the ink cartridge onto the substrate. In still another embodiment of the present disclosure, a piezoelectric ink-jet head is used for ink-jet printing. A piezoelectric ink-jet head includes a reservoir with an inlet port and a nozzle at the other end. One wall of the reservoir consists of a thin diaphragm with an attached piezoelectric crystal. When voltage is applied to the crystal, it contracts laterally, thus deflecting the diaphragm and ejecting a small drop of fluid from the nozzle. The reservoir then refills via capillary action through the inlet. One, and only one, drop is ejected for each voltage pulse applied to the crystal, thus allowing complete control over the when a drop is ejected. In yet another embodiment of the present disclosure, an epoxy delivery system is used to deposit a layer of a device. An example of an epoxy delivery system is the Ivek Digispense 2000 (Ivek Corporation, North Springfield, Vt.). For more information on jet spraying, see, for example, Madou, *Fundamentals of Microfabrication*, Second Edition, 2002, pp. 164-167, CRC Press, which is hereby incorporated by reference herein in its entirety.

6.10. Vacuum Evaporation

In one embodiment of the present disclosure, one or more layers of the deposit materials are deposited by vacuum evaporation. Vacuum evaporation takes place inside an evacuated chamber. The chamber can be, for example, a quartz bell jar or a stainless steel enclosure. Inside the chamber is a mechanism that evaporates the metal source, a wafer holder, a shutter, thickness and rate monitors, and heaters. The chamber is connected to a vacuum pump. There are any number of different ways in which the metal is evaporated within the chamber, including filament evaporation, E-beam gun evaporation, and hot plate evaporation. See, for example, Van Zant, *Microchip Fabrication*, Fourth Edition, McGraw-Hill, New York, 2000, pp. 407-411, which is hereby incorporated by reference herein in its entirety.

6.11. Sputter Deposition/Physical Vapor Deposition

In another embodiment of the present disclosure, one or more layers of the deposit materials are deposited by sputtering. Sputtering, like evaporation, takes place in a vacuum. However, it is a physical not a chemical process (evaporation is a chemical process), and is referred to as physical vapor deposition. Inside the vacuum chamber is a slab, called a target, of the desired film material. The target is electrically grounded. An inert gas such as argon is introduced into the chamber and is ionized to a positive charge. The positively charged argon atoms are attracted to the grounded target and accelerate toward it.

During the acceleration they gain momentum, and strike the target, causing target atoms to scatter. That is, the argon atoms "knock off" atoms and molecules from the target into the chamber. The sputtered atoms or molecules scatter in the chamber with some coming to rest on the wafer. A principal feature of a sputtering process is that the target material is deposited on the wafer with chemical or compositional change. In some embodiments of the present disclosure, direct current (DC) diode sputtering, radio frequency (RF) diode sputtering, triode sputtering, DC magnetron sputtering or RF magnetron sputtering is used. See, for example, Van Zant, *Microchip Fabrication*, Fourth Edition, McGraw-Hill, New York, 2000, pp. 411-415; U.S. Pat. No. 5,203,977; U.S. Pat. No. 5,486,277; and U.S. Pat. No. 5,742,471, each of which is hereby incorporated by reference herein in its entirety.

RF diode sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes is reversed at very high frequencies to prevent the formation of a positive charge on the cathode that would stop the ion bombardment process. Since the electrode polarity is reversed at a radio frequency, this process is referred to as 133 sputtering. Magnetron sputtering is different form of sputtering. Magnetron sputtering uses a magnetic field to trap electrons in a region near the target surface thus creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

6.12. Collimated Sputtering

In another embodiment of the present disclosure, one or more layers of the deposit materials are deposited by collimated sputtering. Collimated sputtering is a sputtering process where the arrival of metal occurs at an angel normal to the wafer surface. The metal is collimated by a thick honeycomb grid that effectively blocks off angle metal atoms in some embodiments. Alternatively, ionizing the metal atoms and attracting them towards the wafer collimates the metal. Collimated sputtering improves filling of high aspect ratio contacts.

6.13. Laser Ablated Deposition

In another embodiment of the present disclosure, one or more layers of the deposit materials are deposited by laser ablated deposition. In one form of laser ablated deposition, a rotating cylindrical target surface is provided for the laser ablation process. The target is mounted in a vacuum chamber so that it is rotated about the longitudinal axis of the cylindrical surface target and simultaneously translated along the longitudinal axis. A laser beam is focused by a cylindrical lens onto the target surface along a line that is at an angle with respect to the longitudinal axis to spread a plume of ablated material over a radial arc. The plume is spread in the longitudinal direction by providing a concave or convex lateral target surface. The angle of incidence of the focused laser beam is other than normal to the target surface to provide a glancing geometry in some embodiments. Simultaneous rotation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films. See, for example, U.S. Pat. No. 5,049,405, which is hereby incorporated by reference herein in its entirety.

6.14. Molecular Beam Deposition

In another embodiment of the present disclosure, one or more layers of the deposit materials are deposited by molecular beam deposition. Molecular beam deposition is a method of growing films, under vacuum conditions, by directing one or more molecular beams at a substrate. In some instances, molecular beam deposition involves epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition includes both epitaxial growth and nonepitaxial growth processes. Molecular beam deposition is a variation of simple vacuum evaporation. However, molecular beam deposition offers better control over the species incident on the substrate than does vacuum evaporation. Good control over the incident species, coupled with the slow growth rates that are possible, permits the growth of thin layers having compositions (including dopant concentrations) that are precisely defined. Compositional control is aided by the fact that growth is generally at relatively low substrate temperatures, as compared to other growth techniques such as liquid phase epitaxy or chemical vapor deposition, and diffusion processes are very slow.

Essentially arbitrary layer compositions and doping profiles are obtained with precisely controlled layer thickness. In fact, layers as thin as a monolayer are grown by MBE. Furthermore, the relatively low growth temperature permits growth of materials and use of substrate materials that could not be used with higher temperature growth techniques. See for example, U.S. Pat. No. 4,681,773, which is hereby incorporated by reference herein in its entirety.

6.15. Ionized Physical Vapor Deposition

In another embodiment of the present disclosure, one or more layers of the deposit materials are deposited by ionized physical vapor deposition (I-PVD), also known as ionized metal plasma (IMP). In I-PVD, metal atoms are ionized in an intense plasma. Once ionized, the metal is directed by electric fields perpendicular to the wafer surface. Metal atoms are introduced into the plasma by sputtering from the target. A high density plasma is generated in the central volume of the reactor by an inductively coupled plasma (ICP) source. This electron density is sufficient to ionize approximately 80% of the metal atoms incident at the wafer surface. The ions from the plasma are accelerated and collimated at the surface of the wafer by a plasma sheath. The sheath is a region of intense electric field that is directed toward the wafer surface. The field strength is controlled by applying a radio frequency bias.

6.16. Ion Bear Deposition

In another embodiment of the present disclosure, one or more layers of the deposit materials are deposited by ion beam deposition (IBD). IBD uses an energetic, broad beam ion source carefully focused on a grounded metallic or dielectric sputtering target. Material sputtered from the target deposits on a nearby substrate to create a film. Most applications also use a second ion source, termed an ion assist source (IAD), which is directed at the substrate to deliver energetic noble or reactive ions at the surface of the growing film. The ion sources are "gridded" ion sources and are typically neutralized with an independent electron source. IBD processing yields excellent control and repeatability of film thickness and properties. Process pressures in IBD systems are approximately $10^{-4}$ Torr. Hence, there is very little scattering of either ions delivered by the ion sources or material sputtered from the target of the surface. Compared to sputter deposition using magnetron or diode systems, sputter deposition by IBD is highly directional and more energetic. In combination with a substrate fixture that rotates and changes angle, IBD systems deliver a broad range of control over sidewall coatings, trench filling and liftoff profiles.

6.17. Atomic Layer Deposition

In another embodiment of the present disclosure, one or more layers of the deposit materials are deposited by atomic layer deposition. Atomic layer deposition is also known as atomic layer epitaxy, sequential layer deposition, and pulsed-gas chemical vapor deposition. Atomic layer deposition involves use of a precursor based on self-limiting surface reactions. Generally, an object is exposed to a first species that deposits as a monolayer on the object. Then, the monolayer is exposed to a second species to form a fully reacted layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films," U.S. Pat. No. 4,413,022 to Suntola et al., entitled "Method for Performing Growth of Compound Thin Films," to Ylilammi, and George et al., 1996, J. Phys. Chem. 100, pp. 13121-13131, each of which is hereby incorporated by reference herein in its entirety. Atomic layer deposition has also been described as a chemical vapor deposition operation performed under controlled conditions that cause the deposition to be self-limiting to yield deposition of, at most, a monolayer. The deposition of a monolayer provides precise control of film thickness and improved compound material layer uniformity. Atomic layer deposition is performed using equipment such as the Endura Integrated Cu Barrier/Seed system (Applied Materials, Santa Clara, Calif.).

6.18. Hot Filament Chemical Vapor Deposition

In another embodiment of the present disclosure, one or more layers of the deposit materials are deposited by hot filament chemical vapor deposition (HFCVD). In HFCVD, reactant gases are flowed over a heated filament to form precursor species that subsequently impinge on the substrate surface, resulting in the deposition of high quality films. HFCVD has been used to grow a wide variety of films, including diamond, boron nitride, aluminum nitride, titanium nitride, boron carbide, as well as amorphous silicon nitride. See, for example, Deshpande et al., 1995, J. Appl. Phys. 77, pp. 6534-6541, which is hereby incorporated by reference herein in its entirety.

6.19. Screen Printing

In another embodiment of the present disclosure, one or more layers of the deposit materials are deposited by a screen printing (also known as silk-screening) process. A paste or ink is pressed onto portions of an underlying structure through openings in the emulsion on a screen. See, for example, Lambrechts and Sansen, *Biosensors: Microelectrochemical Devices*, The Institute of Physics Publishing, Philadelphia, 1992, which is hereby incorporated by reference in its entirety. The paste consists of a mixture of the material of interest, an organic binder, and a solvent. The organic binder determines the flow properties of the paste. The bonding agent provides adhesion of particles to one another and to the substrate. The active particles make the ink a conductor, a resistor, or an insulator. The lithographic pattern in the screen emulsion is transferred onto portions of the underlying structure by forcing the paste through the mask openings with a squeegee. In a first step, paste is put down on the screen. Then the squeegee lowers and pushes the screen onto the substrate, forcing the paste through openings in the screen during its horizontal motion. During the last step, the screen snaps back, the thick film paste that adheres between the screening frame and the substrate shears, and the printed pattern is formed on the substrate. The resolution of the process depends on the openings in the screen and the nature of the paste. With a 325-mesh screen (i.e., 325 wires per inch or 40 µM holes) and a typical paste, a lateral resolution of 100 µM can be obtained.

For difficult-to-print pastes, a shadow mask, such as a thin metal foil with openings, complements the process. However, the resolution of this method is inferior (>500 µM). After printing, the wet films are allowed to settle for a period of time (e.g., fifteen minutes) to flatten the surface while drying. This removes the solvents from the paste. Subsequent firing burns off the organic binder, metallic particles are reduced or oxidized, and glass particles are sintered. Typical temperatures range from 500° C. to 1000° C. After firing, the thickness of the resulting layer ranges from 10 µM to 50 µM. One silk-screening setup is the DEK 4265 (Universal Instrument Corporation, Binghamton, N.Y.). Commercially available inks (pastes) that can be used in the screen printing include conductive (e.g., Au, Pt, Ag/Pd, etc.), resistive (e.g., $RuO_2$, $IrO_2$), overglaze, and dielectric (e.g., $Al_2O_3$, $ZrO_2$). The conductive pastes are based on metal particles, such as Ag, Pd, Au, or Pt, or a mixture of these combined with glass. Resistive pastes are based on $RuO_2$ or $Bi_2Ru_2O_7$ mixed with glass (e.g., 65% PBO, 25% $SiO_2$, 10% $Bi_2O_3$).

The resistivity is determined by the mixing ratio. Overglaze and dielectric pastes are based on glass mixtures. Different melting temperatures can be achieved by adjusting the paste composition. See, for example, Madou, *Fundamentals of Microfabrication*, Second Edition, CRC Press, Boca Raton, Fla., 2002, pp. 154-156, which is hereby incorporated by reference herein in its entirety.

6.20. Electroless metal deposition

In another embodiment of the present disclosure, one or more layers of the deposit materials are deposited by electroless metal deposition. In electroless plating a layer is built by chemical means without applying a voltage. Electroless plating baths can be used to form Au, Co—P, Cu, Ni—Co, Ni—P, Pd, or Pt layers. See, for example, Madou, *Fundamentals of Microfabrication*, Second Edition, CRC Press, Boca Raton, Fla., 2002, pp. 344-345, which is hereby incorporated by reference herein in its entirety.

6.21. Electroplating

In another embodiment of the present disclosure, one or more layers of the deposit materials are deposited by electroplating. Electroplating takes place in an electrolytic cell. The reactions that take place in electroplating involve current flow under an imposed bias. In some embodiments, a layer is deposited as part of a damascene process. See, for example, Madou, Fundamentals of Microfabrication, Second Edition, CRC Press, Boca Raton, Fla., 2002, pp. 346-357, which is hereby incorporated herein by reference in its entirety.

7. Lithographic Etching Methods

The following subsections describe lithographic etching techniques that can be used in the fabrication methods described above. One of skill in the art will appreciate that etching or patterning the substrate can be conducted using other methods including, but not limited to, direct write technologies, Block Copolymer techniques and frequency doubling techniques.

7.1. Cleaning and Dehydration Baking

In some embodiments in accordance with the present disclosure, the fabrication methods begin with a cleaning process. Substrate cleaning is an important step in a lithographic process if there is contamination in presence, as the contamination can severally compromise the adhesion of the resist to the substrate. Substrate surfaces have four general types of contamination: particulates, organic residues, inorganic residues, and unwanted oxide layers. Depending on the substrate and the type of contaminants, several cleaning techniques can be used. These methods include dry cleaning, wet cleanings, ultrasonic agitation, polishing with abrasive corn pounds, supercritical cleaning.

In some embodiments, a wet cleaning is used to remove organic materials from the substrate and prepare for the adhesion of the resist to the substrate. It is carried out by submerging a substrate in a bath or by rinsing the substrate with DI water and/or a solvent rinse. After the wet cleaning, the substrate is dried to remove moistures. Several drying techniques can be used. For example, in some embodiments, the substrate after wet cleaning can be dried using dehydration bake method. In this method, the substrate is baked at a temperature for a period of time such as baked at 80° C. for several minutes. In some embodiments, the substrate may be dried by $N_2$ flow or spinning. More detailed information with regard to cleaning and drying of a substrate can be found, for example, in Van Zant, Microchip Fabrication, Forth Edition, McGraw-Hill, New York, 2000, pp. 87-131, which is hereby incorporated by reference herein in its entirety.

7.2. Adhesion Promotion Coating

To further improve the adhesion of the resist to the substrate, an adhesion promoter can be applied to the substrate before the application of the resist. Depending on the substrate and the resist, various adhesion promoters can be used. In some embodiments, Bis(trimethylsilyl)amine (also known as hexamethyldisilazane, or HMDS) or other organic materials are chosen as the adhesion promoter for the fabrication processes described in the present application.

HMDS is an organosilicon compound with the molecular formula $[(CH_3)_3Si]_2NH$. The molecule is a derivative of ammonia with trimethylsilyl groups in place of two hydrogen atoms. This colorless liquid is a reagent and a precursor to bases that are popular in organic synthesis and organometallic chemistry. In photolithography, HMDS is often used as an adhesion promoter for photoresist, and can be applied using any suitable conventional methods. For example, HMDS can be applied by vapor chemical deposition. In general, good adhesions are obtained by applying HMDS from the gas phase on heated substrates.

7.3. Bottom Anti-Reflective Coating

Optionally, a bottom anti-reflective coating (BARC) may be applied to help reduce image distortions associated with light reflections during lithography. In some cases, BARCs are critical and highly desirable. For example, when the substrate or a layer on the substrate is highly reflective, as in metal and polysilicon layers, light reflections can destroy the pattern resolution by three mechanisms: a) off-normal incident light can be reflected back through the resist that is intended to be masked; b) incident light can be reflected off device features and expose "notches" in the resist; and c) thin-film interference effects can lead to linewidth variations when resist thickness changes are caused by substrate or wafer topology or nonflatness.

BARCs can be either organic or inorganic, and can be applied either before or after the photoresist. Conventional methods, such as spinning, sputtering or chemical vapor deposition, can be used to apply the BARCs. By reducing standing waves, thin-film interference, or specular reflections, a BARC helps shrink line widths and improves the pattern resolution. In some cases, a BARC can absorb the radiation and dissipates the energy as heat. Such a BARC is generally suitable to be applied to a substrate before the resist. This BARC lowers reflectance back into the photoresist that has passed through the photoresist.

7.4. Resist Properties

One form of photolithographic processing in accordance with the present disclosure begins with the coating of a resist layer over the layer of material to be patterned. Another form of photolithographic processing in accordance with the present disclosure applies the resist coating after at least one of the steps described in the previous sections, i.e., cleaning and dehydration baking, adhesion promotion coating or BARC. Resists used to form this resist layer are typically comprised of organic polymers applied from a solution. In some embodiments, the thickness of the resist is determined using Bossung Curve analysis. Bossung Curve analysis is one of the most commonly used tools in lithography. It maps a control surface for critical dimensions as a function of the variables of focus and exposure (dose). A detailed discussion of the Bossung Curve analysis can be found in Zavecz, Metrology, Inspection and Process Control edited by C. Archie, Proceeding of SPIE (2006) Vol. 6152-109.

In some embodiments, this resist layer has a thickness in the range of 0.1 µm to 2.0 µm. Furthermore, in some embodiments, the resist layer has a uniformity of plus or minus 0.01 µm. In some embodiments, the resist layer is applied using a spin technique such as a static spin process or a dynamic dispense process. In some embodiments, the resist layer is applied using a manual spinner, a moving-arm resist dispenser, or an automatic spinner. See, for example, Van Zant, Microchip Fabrication, Forth Edition, McGraw-Hill. New York, 2000, pp. 217-222, which is hereby incorporated by reference herein in its entirety.

Negative Resists.

In some embodiments, the resist layer is an optical resist that is designed to react with ultraviolet or laser sources. In some embodiments, the resist layer is a negative resist in which polymers in the resist form a cross-linked material that is etch resistant upon exposure to light. Examples of negative resists that can be used to make the resist layer include, but are not limited to, azidelisoprene negative resists, polymethyl-methacrylate (PMMA), polymethylisopropyl ketone (PMIPK), poly-butene-1-sulfone (PBS), poly-(trifluoroethyl chloroacrylate) TFECA, copolymer-(V-cyano ethyl acrylate-V-amido ethyl acrylate) (COP), poly-(2-methyl pentene-1-sulfone) (PMPS) and the like.

Positive Resists.

In other embodiments, the resist layer (e.g., positive resist layer of FIG. 2A) is a positive resist. The positive resist is relatively insoluble. After exposure to the proper light energy, the resist converts to a more soluble state. This reaction is called photosobulization. One positive photoresist in accordance with the present disclosure is the phenol-formaldehyde polymer, also called phenol-formaldehyde novolak resin. See, for example, DeForest, Photoresist: Materials and Processes, McGraw-Hill, New York, 1975, which is hereby incorporated by reference herein in its entirety. In some embodiments, the resist layer is LOR OSA, LOR 5 0.7A, LOR IA, LOR 3A, or LOR 5A (MICROCHEM, Newton, Mass.). LOR lift-off resists use polydimethylglutarimide.

7.5. Soft Baking

After the resist layer has been applied, the density is often insufficient to support later processing. And some solvent may inhibit the exposure curve. Accordingly, in some embodiments of the present disclosure, a bake is used to densify the resist layer and drive off residual solvent or excess carrier solvent from the resist layer. After the bake, the resist becomes less tacky and the thickness of the resist layer is reduced slightly. This bake is referred to as a softbake, prebake, or post-apply bake. Several methods of baking the resist layer are contemplated by the present disclosure including, but not limited to, convection ovens, infrared ovens, microwave ovens, or hot plates. See, e.g, Levinson, Principles of Lithography, SPIE Press, Bellingham, Wash., 2001, pp. 68-70, which is hereby incorporated by reference herein in its entirety.

7.6. Alignment and Exposure of the Mask

After the spacer has been coated with a resist layer, the next step is alignment and exposure of the resist layer. Alignment and exposure is, as the name implies, a two-purpose photo-masking step. The first part of the alignment and exposure step is the positioning or alignment of the required image on the material surface. The image is found on a mask. The second part is the encoding of the image in the resist layer from an exposing light or radiation source. In the present disclosure, any conventional alignment system can be used to align the mask with the resist layer, including but not limited to, contact aligners, proximity aligners, scanning projection aligners, steppers, step and scan aligners, x-ray aligners, and electron beam aligners. For a review of aligners that can be used in the present disclosure, see, e.g., Solid State Technology, April 1993, p. 26; and Van Zant, Microchip Fabrication, Fourth Edition, McGraw-Hill, New York, 2000, pp. 232-241, each of which in incorporated herein by reference in its entirety. Masks can be negative or positive.

A positive mask (not shown) used to develop a positive resist would have the opposite pattern of a negative mask. Both negative masks and positive masks used in the methods of the present disclosure are fabricated with techniques similar to those used in wafer processing. A photomask blank, consisting of an opaque film (usually chromium) deposited on glass substrates, is covered with resist. The resist is exposed according to the desired pattern, is then developed, and the exposed opaque material etched. Mask patterning is accomplished primarily by means of beam writers, which are tools that expose mask blanks according to suitably formatted biosensor electrode patterns. In some embodiments, electron or optical beam writers are used to pattern negative masks or positive masks. See, e.g., Levison, Principles of Lithography, SPIE Press, Bellingham, Wash., 200 1, pp. 229-256, which is hereby incorporated by reference herein in its entirety.

Exposing the resist to light breaks or forms chemical bonds in the resist layer. The final image matches the desired pattern from the mask or interference pattern. In various embodiments, attention is focused on providing uniformity of the light intensity and/or controlling the exposure rate.

In one embodiment of the present disclosure, the tool used to project the pattern of a mask onto a device is a wafer stepper. Wafer steppers exist in two configurations, step-and-repeat and step-and-scan. In a step-and-repeat system, the entire area of the mask to be exposed is illuminated when a shutter is opened. In a step-and scan system, only part of the mask, and therefore only part of the exposure field on the device unit, is exposed when a shutter is opened. The entire field is exposed by scanning mask and the device being patterned synchronously. See, e.g., Levison, Principles of Lithography, SPIE Press, Bellingham, Wash., 200 1, pp. 1 33-174, which is hereby incorporated by reference herein in its entirety.

7.7. Post Expose Bake

Before developing the resist, a post exposure bake (PEB) is optionally performed after exposure. In some cases where high resolutions are not required, the PEB is not necessary. However, for certain resists or for high resolutions, a PEB is inevitable for the crosslinking induced by the exposure.

PEB can be applied above the softening point of the resist without destroying the structures to be developed. For example, a PEB can be performed at 110° C., for 1-2 min on a hotplate. A PEB performed near the softening point of the photo resist can reduce mechanical stress formed during soft-bake and exposure. A PEB can also promote the thermally activated diffusion of carboxylic acid formed during exposure from the photo active compound. This diffusion step smoothes the spatial periodic pattern of carboxylic acid, which in turn will help to improve the image or pattern resolution.

7.8. Development

After exposure through a mask, the pattern is coded as a latent image in resist as regions of exposed and unexposed resist. The pattern is developed in the resist by chemical dissolution of the unpolymerized resist regions. A number of development techniques can be used to develop the resist. Development techniques are designed to leave in the resist layer an exact copy of the pattern that was on the mask or reticle. The successful development of the image coded in resist is dependent on the nature of the resist's exposure mechanisms.

Negative resist, upon exposure to light, goes through a process of polymerization which renders the resist resistant to dissolution in the developer chemical. The dissolving rate between the two regions is high enough so that little of the layer is lost from the polymerized regions. The chemical preferred for many negative-resist-developing situations is xylene or Stoddart solvent. The development step is done with a chemical developer followed by a rinse. For negative resists, the rinse chemical is n-butyl acetate in some embodiments.

Positive resists present a different developing condition. The two regions, polymerized and unpolymerized, have a different dissolving rate. This means that during the developing step some resist is always lost from the polymerized region. Use of developers that are too aggressive or that have overly long developing times result in an unacceptable thinning of the resist. Two types of chemical developers used with positive resists in accordance with the present disclosure are alkaline-water solutions and nonionic solutions. The alkaline-water solutions can be sodium hydroxide or potassium hydroxide. Typical nonionic solutions include, but are not limited to, tetramethylamrnonimurn hydroxide (TMAH). The rinse chemical for positive-resist developers is water. A rinse is used for both positive and negative resists. This rinse is used to rapidly dilute the developer chemical to stop the developing action.

There are several methods in which a developer is applied to resist in order to develop the latent image. Such methods include, but are not limited to, immersion, spray development, and puddle development. In some embodiments of the present disclosure, wet development methods are not used. Rather, a dry (or plasma) development is used. In such dry processes, a plasma etcher uses energized ions to chemically dissolve away either exposed or unexposed portions of the resist layer without first developing the resist layer using wet chemical techniques.

In some embodiments, in particular when an organic compound is used as the photoresist, the chemical reaction in the resist layer needs to be controlled to ensure the image fidelity. This can be achieved by controlling the exposure time, the development time, or other processing parameters. Image fidelity herein refers to the ability of a lithographic process to render an image accurately, without any visible distortion or information loss.

7.9. Hard Baking

In some embodiments of the present disclosure, resist is hard baked after it has been developed. The purpose of the hard bake is to achieve good adhesion of the resist layer to the underlying layer to be patterned. In some embodiments, a hard bake is accomplished using a convection oven, in-line or manual hot plates, infrared tunneling ovens, moving-belt convection ovens, vacuum ovens and the like. General baking temperature and baking times are provided by the resist manufacture. Therefore, specific baking temperatures and times is application dependent. Usually the hard baking temperature is the hottest or highest temperature among all of the processes. Nominal hard bake temperatures are from 130° C. to 200° C. for thirty minutes in a convection oven. The hard baking sets the resist and enhances mechanical stability of the resist for the subsequent etch or implant process. At this point, the image fidelity is usually measured and fed back to the preceding lithographic steps.

7.10. Etching

After development, an etching step is used for patterning. A number of etching methods are available. Etching can be divided into dry and wet etching. The following disclosure provides examples of such etching. It will be understood by one of skill in the art that the disclosed etching methods can be used independently of the preceding lithographic steps in accordance with some embodiments. It will be further understood by one of skill in the art that the disclosed etching methods can be used with the preceding lithographic steps in accordance with some embodiments. Wet etching is the use of acidic or basic solutions to solvate away a specific reacted species. Examples are silicon dioxide being etched in hydrofluoric acid, or $Si_3N_4$ in hot phosphoric acid, or mono-crystalline silicon in potassium hydroxide (KOH)). Photoresist materials are removed by acid or base materials (depending on polarity and resist chemistry).

The following list is a generic categorization of the classifications of etches methods. Each etch method has specialized equipment for optimization of the process. Complexity has evolved to the point where some of the terms and techniques are interchangeable. For example, there are terms depending on the vendor, for inductive coupled plasma (ICP) etch or transformer coupled plasma (TCP), each which improves an ion etcher.

7.10.1 Wet Etching

In wet etching, etchant is introduced either as a liquid bath with submersion or a surface spray/mist. Material is removed as a function of solvation of the etch intermediate or byproduct. A limitation of wet etching is the wetting function of the chemical. Some etchants are two step reactions such as oxidation of a material then solvation of the oxide.

Wet etches can also be used in combination with the dry etches as a preparatory step for surface cleaning or contaminate removal. An example is organic material removal prior to a reactive ion etch. Wet etches are isotropic or follow crystal lattices.

In one embodiment of the present disclosure, the structure to be patterned is immersed in a tank of an etchant for a specific time. Then the structure is transferred to a rinse station for acid removal, and transferred to a station for final rinse and a spin dry step.

Wet Spray Etching or Vapor Etching.

In some embodiments of the present disclosure, wet spray etching or vapor etching is used for patterning. Wet spray etching offers several advantages over immersion etching including the added definition gained from the mechanical pressure of the spray. In vapor etching, the wafer is exposed to etchant vapors such as hydroflowic acid vapors.

Ion Beam Etching.

Another type of etcher that is used to perform the etching of spacer 140 in accordance with various aspects of the present disclosure is ion beam etching. Unlike chemical plasma systems, ion beam etching is a physical process. The structure to be etched is placed on a holder in a vacuum chamber and a stream of argon is introduced into the chamber. Upon entering the chamber, the argon is subjected to a stream of high-energy electrons from a set of cathode (−)-anode (+) electrodes. The electrons ionize the argon atoms to a high-energy state with a positive charge. The wafers are held on a negatively grounded holder that attracts the ionized argon atoms. As the argon atoms travel to the wafer holder they accelerate, picking up energy. At the wafer surface, they crash into the exposed wafer layer and blast small amounts from the wafer surface. No chemical reaction takes place between the argon atoms and the wafer material. The material removal (etching) is highly directional (anisotropic), resulting in good definition in small openings.

7.10.2 Dry Etching—Reactive-Ion Etching

Dry etching encompasses other methods outside the wet etch environment. Basic mechanics includes excitation of a chemical to an ionic state and then reaction with the substrate and films. Material is removed either by physical/mechanical methods or chemical conversion and solvation into the gas stream.

Sputter (Physical/Mechanical).

In sputter approaches, ions or elements are accelerated to a high energy and directed toward a surface. Surfaces are removed due to the collisions of these highly charged ions, much like a nanoscale sandblasting method. Sputter etching is facilitated by charging the ion and then establishing a high bias towards to the substrate. Removal is line of sight from the target in the direction of the bias. Sputter etching is a method to achieve anisotropic etch profiles. Sputtering can also be accomplished by directional ion bombardment by 'ion guns'. Examples include focused ion beam (FIB) or other direct write approaches.

Chemical (Slovation—Liquid or Gas).

Chemical enhanced etching exploits generation of intermediate species that can be solvated in the solution or vaporized in the low pressure chamber. Chemical etching is tuned to generate the solvated states due to the chemicals included in the reaction mixture. For example, chlorine is used for most metals. A fluorine based chemical such as carbontetrafluoride ($CF_4$) or sulfurfluoride ($SF_6$) is used for etching silicon or silicon oxide. Oxide etches with $CF_4$ or $SF_6$ follows the same reaction mechanism as the wet etch with HF acid.

Chemical etch is more isotropic in nature than the corresponding sputtering systems. A technique of alternating and combining the two methods can sculpt complex side wall profiles. The present disclose encompasses the use of such methods to generate the specific nodes for functionality. An example is the 'wine glass' structure disclosed FIG. 7 of related application No. 61/802,006, filed Mar. 15, 2013, which is hereby incorporated by reference herein for its disclosure of such structures.

Plasma Etching.

Plasma generation is a method for ionization in the dry etch process. Plasmas can be tuned and controlled for the different gases used. Plasma can be struck with one gas and maintained by another. Relative location of the plasma can increase etch rate or impact resultant damage. Some systems apply remote plasma generation sources while others control the confinement and immersion in the plasma. Generally there is a dilution or carrier gas that maintains the plasma and then a small volume of reactive gas is introduced. Vacuum levels define the type of plasma etching and complexity for control. Power of the generator is a control factor as well as the frequency.

In some embodiments, plasma etching is performed using a plasma etcher. Physically, a plasma etcher comprises a chamber, vacuum system, gas supply, and a power supply. The structure to be etched is loaded into the chamber and the pressure inside is reduced by the vacuum system. After the vacuum is established, the chamber is filled with the reactive gas. For the etching of silicon dioxide, for example, the gas is usually $CF_4$ that is mixed with oxygen. A power supply creates a radio frequency (RE) field through electrodes in the chamber. The field energizes the gas mixture to a plasma state. In the energized state, the fluorine attacks the silicon dioxide, converting it into volatile components that are removed from the system by the vacuum system.

Any of a wide variety of plasma etchers is used to perform etching, in accordance with various embodiments of the present disclosure. Such etchers include, but are not limited to, barrel etchers, plasma planar systems, electron cyclotron resonance sources, high density reflected electron sources, helicon wave sources, inductively coupled plasma sources, and transformer coupled plasma sources.

In some embodiments, a reactive ion etcher system combines plasma etching and ion beam etching principles. The systems are similar in construction to the plasma systems but have a capability of ion milling. The combination brings the benefits of chemical plasma etching along with the benefits of directional ion milling. See, e.g., Van Zant, Microchip Fabrication, Fourth Edition, McGraw-Hill, New York, 2000, pp. 256-270, which is hereby incorporated herein by reference for more information on etching techniques and etching equipment that can be used in accordance with the present disclosure.

7.10.3 Characteristics of an Etch Process.

The etch process generates an artifact or signature of the processing employed. Knowledge of how to apply etching methods determines the final profile of the structure. Definitions for the following terms are provided in order to convey an understanding of the etch processing characteristics.

Isotropic Etching.

Isotropic implies equal etching in all directions. The two references are vertical and horizontal directions. An isotropic etch 'undercuts' the mask at a ratio to the vertical depth etched. Impact is that a circular opening of 1 micron when etched to a 0.5 micron depth would have a bowl like shape that is 2 microns at the top of the bowl, 1 micron at the bottom, with rounded side walls. An important consideration here is that if a conformal film were deposited over a topography/structure, an isotropic etch would remove the horizontal material as well as the side wall/vertical material. There is no shadowing or off line of sight protection from an isotropic etch (excluding rate limiting or aspect ratio physical diffusivity barriers). This characteristic is used in cleans and sacrificial film removals. One trick is to use isotopic etching to consume the side walls, thereby reducing the critical dimension.

Anisotropic Etching.

Anisotropic etching is preferential etching in one direction over the other. Hence the term anisotropic: not isotropic. Ability to produce anisotropic etch chemistries allows for denser packing of devices. Anisotropy is limited by the bias and directionality of the tool utilized. The mask image is transferred into the substrate with fidelity: a 1 micron circular opening etched to 0.5 micron depth is 1 micron by 0.5 micron feature in the substrate.

An application for the disclosed technology is considering the etching of a conformal coating. If the deposited film is 0.25 microns over a 0.8 micron step, an anisotropic etch removes the 0.25 microns on the surface (horizontal surface) but leaves the side wall (vertical surface) material. Thereby an anisotropic etch results in a new structure of the deposited material where an isotropic etch would remove all material. Limitations on anisotropic etches are physical limitations that inhibit reactive species reaching the bottom surface of the etch location. These topics are defined in 'aspect ratio', 'poisoning', 'etch stops' and other terms below.

7.10.4 Etching Definitions and Examples

Etch rate—A function of the process recipe which quantifies how fast a material is removed. Units are expressed in removed thickness per time, e.g. Angstroms per second. Etch rate includes lateral calculation as well as the vertical component. Etch rate can be reduced by addition of diluents or carrier gases that do no enhance the etch reaction. Etch rate is modified to compensate for reaction chamber design where the etch rate in the center may be higher than on the outer edge. Etch rate is sacrificed for uniformity and repeatability. High etch rates are desirable for manufacturability. However, etch rate is only one part of the grand compromise for a final etch process.

Selectivity—A comparative etch rate ratio of the desired material to be etched and the protective mask material (ratio of material etch rate over mask etch rate). A high selectivity is desired to maintain transfer of the lithography into the substrate. If the selectivity is low the differentiation between starting structure and final structure is compromised due to loss of mask. Etch chemistries are adjusted to achieve the highest selectivity possible without compromising process time for the material etch rate. High selectivity with an Angstrom per hour etch rate is not practical in typical embodiments.

Side wall slope—A desired etch profile could be a perfect transfer of the mask image into the substrate material with vertical sidewalls. The most common etch artifact is an oblique angle slope where the top is wider than the bottom. This can be caused from various etch conditions. A primary mechanism for this is that the etch reaction is hindered by diffisivity of the etchant, by-product interference, loss of ionization states, or competitive nonproductive reactions. In the instant disclosure, both vertical side wall, oblique and reentry angled structures are contemplated through the disclosed etching techniques.

Re-entrant Side wall—The opposite of the oblique angle side wall is the re-entrant side wall angle. Here the bottom is wider than the top masked surface. This profile can be obtained by segmented etching with increasingly isotropic etch recipes. The isotropic undercuts by the lateral etch nature. The resultant structure resembles the dove tail joint in wood working. Another method for reentrant side walls is the enhancement of the etch rate in the trench as a function of dopant materials.

Inhibitor Sidewall protection due to byproduct re-deposition. Another control method for side wall profile is due to the nature of the etchant reaction. The etch reaction may generate a by-product that is not highly volatile. These compounds redeposit on the side wall during the reaction. In an isotropic etch it stops the lateral etch at the top but does not hinder at the bottom area. Re-deposition is viewed as both a positive and negative aspect of the process. Such re-deposition is advantageously used in the present disclosure.

Erosion. A method to increase the oblique slope of a side wall during an etch process is to erode the masking material at the edges. This is usually a function of heating the mask material during the etch process. This has the impact that the edge acuity of the resist is lost, resulting in the feature size being gradually reduced with etch time. Resist erosion reduces the critical dimension at the top of the feature. Examples of extreme erosion would produce teepee or pyramid like structures Etch Stop. An etch stop material is a material that has a very low etch rate that is built as a sandwich structure in a device. As the target material is etched the structure is defined. However when the etchant hits the etch stop material the maximum depth is reached. This is a method to control the depth of an etch material with high precision. Deposition sandwich can be controlled uniformly across the substrate regardless of the etch reactor design or non uniformity. A second artifact is that the amount of over etch time can be extended and only the lateral etch will continue. Lateral etch results in re-entrant slopes or critical dimension reduction.

Self limiting or poisoning. An etch recipe can be designed in which there is a limitation of the etchant material. Then due to physical constraint such as aspect ratio, dilution, power or bias, the effective etch is restricted. Evidence of this artifact is in deep trench, 10 to 15 microns, where there is tapering and closure. Regardless of the additional time provided the etch depth does not progress. Poisoning of the reaction has the same results but can be observed by additions to the gas stream that inhibits conversion to the desired species, or a competitive reaction that consumes the reactive species in a nonproductive reaction.

Crystalline specific (lattice orientation). For mono crystalline or highly ordered lattice structures, etchants can be used to highlight and accentuate the lattice structure. For example, iodine based wet etches are used for defect analysis due to different etch rates on the crystal lattice. In some embodiments, crystalline specific etches for special substrate enhancements and for specific devices are used. In some embodiments, metallic etches can improve the surface area for the graphene growth. Moreover, nucleation approaches make use of faceting etch for graphene growth.

7.10.5 Secondary Etch Functions and Utilization

The following provides additional uses for the disclosed etching processes that are used in accordance with some embodiments of the present disclosure.

Cleaning. Etch removal of contaminates accumulated during previous processing steps can be performed. Examples of a standard etch clean process such as the RCA (Clean is 1) application of distilled water, 2) application of buffered ammonium hydroxide, 3) application of dilute HF for ancient oxide, and 4) application of HCl for metallic clean. Clean procedures can also be plasma based prior to a deposition process. A clean process is removing the unwanted films prior to the following step. Cleans can be before etch steps (remove inhibitors), deposition and lithography.

Polish. A light etch step to change the profile slightly or remove unwanted residuals. For segmented film deposition a slight polish removes undesired side wall material and fine tunes by reduction of material the final film thickness.

Structure definition. Previous discussion highlighted the side wall slope as nominal/vertical, oblique, or reentrant angled. Functional nodes can be sculpted in the profile by tuning the etch process. A simple example is he wine glass structure which was designed for metal flow into contact views. As the structures became more complex such as for plasmonics, nodes are defined by crevices or protrusion. Full structures such as a rib or ribbon can be generated by an anisotropic etch of a conformally deposited film. These concepts are captured in our portfolio as related to side walls, segmented film deposition, or fine structure lithography to name a few.

Deep trench and isolation of structures. —State of the art technologies have advanced to do deep trench etches with aspect ratios of 20:1 to greater. One of the benefits of trench formation is the ability to isolate structures on the same substrate. The isolation can be by air or a back fill material (dielectric or oxides. The etch process defines the isolation and the resultant critical dimension of the rib or pillar. Polarity is important because the device functionality can be buried in the bottom of the trench and the wall portions can act as thermal radiators, wave guides, or particulate traps.

Aspect ratios. Aspect ratio is defined by the height of the structure over the width. In the etch process this impacts the diffilsivity of the etchant in a narrow trench (10:1) which will slow the etchant reaction. A secondary concern is the physical stability of a tall feature on a narrow base. Such features are impacted by the microfluidic forces of subsequent processing resulting in toppling or cleavage of the structure.

Side wall deposition. Depending on the application and process engineering this can be a benefit or a detriment. Majority of re-deposition material during an etch process is difficult to remove with later steps (especially metal halides) which is a detriment. The rate of re-deposition can impact the profile of the structure. A benefit of re-deposition is an organic re-deposition or interaction with the photo resist that maintains the resist mask and image fidelity. This re-deposition is a corrective action for undesired resist erosion. Another example of re-deposition being beneficial is when the byproduct material can be formed for a device functionality or structure.

Etch passivation. Slight differentiation, or subset of side wall re-deposition. During an etch step and oxidizing ambient may be used as the etchant chemistry. If there are other layers exposed such as metals (aluminum) a thin oxide will be formed which passivates the secondary surface. Other etch byproducts passivates other materials.

7.10.6 Tool Types

The present disclosure encompasses the use of a wide variety of etch tool configurations. Manufactures of such tools include, but are not limited to, Applied materials, Lam Research, Tegal, Hitachi, Oxford, Plasma Therm, and Branson to name a few. Each company has improvements or enhancements over the competitors. The following list highlights some of the designs and types of reactors on the market: barrel etchers, parallel plate, downstream etchers, ICP, TCP, sinks, spray dispense, oxidation, EBEAM oxidation, and direct write systems. For wet etch (wet sinks) there are numbers of designs for recirculation, purity, automation of multiple baths and inclusion of spin rinse dryers. Note also in the literature some tools are refined to the substrate or material designed to be etched: metal etchers, oxide etchers, etc.

7.11. Residual Layer Removal

The result of the etching process described above is the formation of grooves. Next, the residual layer is removed in a process known as resist stripping in order to yield the patterned structure. In some embodiments, the resist is stripped off with a strong acid such as $H_2SO_4$ or an acid oxidant combination, such as $H_2SO_4$—$Cr_2O_3$, attacking the resist but not the groove to yield the fully patterned structure. Other liquid strippers include organic solvent strippers (e.g., phenolic organic strippers and solventlamine strippers) and alkaline strippers (with or without oxidants). In some embodiments of the present disclosure, a dry plasma process is applied to remove a resist. In such embodiments, the device is placed in a chamber and oxygen is introduced. The plasma field energizes the oxygen to a high energy state which, in turn, oxidizes the resist components to gases that are removed from the chamber by the vacuum pump. In dry strippers, the plasma is generated by microwave, radio frequency, or ultraviolet-ozone sources. More information on photolithographic processes that can be used to pattern devices is found in Madou, Fundamentals of Microfabrication, Second Edition, CRC Press, Boca. Raton, Fla., 2002, pp. 2-65; Van Zant, Microchip Fabrication, Fourth Edition, McGraw-Hill, New York, 2000, Wolf and Tauber, Silicon Processing for the VLSI Era, Second Edition, Lattice Press, Sunset Beach, Calif., 2002; and SZE and Ng, Physics of Semiconductor Devices, Third Edition, Wiley-Interscience, 2007, each of which are hereby incorporated by reference herein in their entireties. Such methods include the use of a positive photoresist rather than a negative photoresist as well as extreme ultraviolet lithography, x-ray lithography, charged-particle-beam lithography, scanning probe lithography, soft lithography, and three-dimensional lithographic methods.

8. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

What is claimed is:

1. A method for forming a graphite-based structure on a substrate comprising:
   (A) patterning the substrate to form a plurality of elements on the substrate, each respective element in the plurality of elements separated from an adjacent element on the substrate by a corresponding trench in a plurality of trenches in the substrate, wherein
      (i) a first element in the plurality of elements has a first surface,
      (ii) a first trench in the plurality of trenches separates the first element from an adjacent element in the plurality of elements, the first trench having a second surface,
      (iii) the first surface and the second surface are separated by a first side wall of the first element,
      (iv) the first surface is characterized by a first elevation,
      (v) the second surface is characterized by a second elevation,
      (vi) the first elevation is other than the second elevation, and
      (vii) a first orthogonal projection of the first surface and a second orthogonal projection of the second surface on a common plane are contiguous or overlapping, and
   (B) concurrently generating a first graphene layer on the entire first surface and a second graphene layer on the entire second surface, wherein the second graphene layer has a thickness that is less than a difference in the first elevation and the second elevation, thereby creating the graphite-based structure in which the second graphene layer is isolated from the first graphene layer, wherein the first graphene layer comprises one or more graphene sheets and wherein the second graphene layer comprises one or more graphene sheets.

2. The method of claim 1, wherein the substrate comprises a dielectric material, a semiconducting material, a metallic material, or a combination thereof.

3. The method of claim 1, wherein the substrate comprises glass, silicon dioxide, neoceram or sapphire.

4. The method of claim 1, further comprising:
   (C) selectively doping the substrate with carbon, subsequent to the patterning (A) but prior to the concurrently generating (B), to produce a first carbide layer within the first surface of the substrate or a second carbide layer within the second surface of the substrate.

5. The method of claim 4, wherein the doping the substrate with carbon comprises ion implantation to the entire first surface or the entire second surface with elemental carbon.

6. The method of claim 5, wherein the ion implantation is performed with a dose in a range that is between $10^8$ ions/cm$^2$ and $10^{21}$ ions/cm$^2$, and energy in a range that is between 5 KeV and 400 KeV.

7. The method of claim 2, further comprising:
   (C) selectively doping the substrate with a first dopant, thereby producing the first graphene layer or the second graphene layer with a first charge carrier, wherein
      the doping the substrate with the first dopant is conducted either (i) prior to or (ii) subsequently to the concurrently generating (B) when the substrate comprises the semiconducting material, and
      the doping the substrate with the first dopant is conducted subsequent to the concurrently generating (B) when the substrate comprises the dielectric material or the metallic material.

8. The method of claim 7, wherein the first dopant is an acceptor producing a p-type doping or a donor producing an n-type doping.

9. The method of claim 7, further comprising:
(D) selectively doping the substrate with a second dopant, thereby producing the first graphene layer or the second graphene layer with a second charge carrier, wherein
the doping the substrate with the second dopant is conducted prior to or subsequent to the concurrently generating (B) when the substrate comprises the semiconducting material, and
the doping the substrate with the second dopant is conducted subsequent to the concurrently generating (B) when the substrate comprises the dielectric material or the metallic material,
the second dopant is different than the first dopant, and
the second charge carrier has a charge opposite to the first charge carrier.

10. The method of claim 9, wherein the second dopant is an acceptor producing a p-type doping or a donor producing an n-type doping.

11. The method of claim 9, wherein the doping the substrate with the first dopant and the doping the substrate with the second dopant are performed concurrently or sequentially.

12. The method of claim 9, wherein the substrate is doped with the first dopant having a first concentration and with the second dopant having a second concentration, wherein the first concentration is different than or the same as the second concentration.

13. The method of claim 9, wherein
the first graphene layer or the second graphene layer includes a first portion and a second portion adjacent to the first portion,
the first portion has the first charge carrier and the second portion has the second charge carrier, thereby creating a PN junction between the first portion and second portion of the first graphene layer or the second graphene layer.

14. The method of claim 13, wherein the first graphene layer or the second layer further includes a third portion adjacent to the second portion, wherein the third portion has the first carrier, the first portion, the second portion, and the third portion collectively creating a PNP or NPN bipolar junction in the first graphene layer or the second graphene layer.

15. The method of claim 13 wherein
the first portion includes a first sub-layer of the first graphene layer or the second graphene layer; and
the second portion includes a second sub-layer of the first graphene layer or the second graphene layer, the second sub-layer overlaying on the first sub-layer.

16. The method of claim 14, wherein
the first portion includes a first sub-layer of the first graphene layer or the second graphene layer;
the second portion includes a second sub-layer of the first graphene layer or the second graphene layer, the second sub-layer overlaying on the first sub-layer; and
the third portion includes a third sub-layer of the first graphene layer or the second graphene layer, the third sub-layer overlaying on the second sub-layer.

17. The method of claim 1, wherein the patterning the substrate to form the plurality of elements comprises (i) etching the first trench in the substrate or (ii) depositing the first element on the substrate, wherein a top of the first element defines the first surface.

18. The method of claim 17, wherein the patterning the substrate to form the plurality of elements comprises depositing the first element on the substrate, wherein a top of the first element defines the first surface and wherein the depositing the first element on the substrate further comprises:
sputtering a metallic catalyst on the substrate prior to sputtering deposition of carbide or carbon, thereby promoting subsequent growth of the first graphene layer or the second graphene layer.

19. The method of claim 1, wherein the first orthogonal projection of the first surface of the first element on the common plane has a first width and the second orthogonal projection of the second surface of the first trench on the common plane has a second width, wherein
the first width is in a range that is between 2 nm and 250 nm; and
the second width is in a range that is between 5 nm and 500 nm.

20. The method of claim 1, wherein the first element is a rib, a mesa, or a pillar.

21. The method of claim 1, wherein the first side wall has an obtuse entry angle with respect to the first surface, thereby causing the combination of the first surface and the second surface to have a combined surface area that is greater than a surface area of the corresponding portions of the substrate prior to the patterning.

22. The method of claim 1, further comprising:
passivating the first side wall, prior to the concurrently generating (B), thereby inhibiting graphene growth on the first side wall during the concurrently generating (B), wherein passivating the first side wall comprises depositing a protection layer on the first side wall.

23. The method of claim 22, wherein the depositing the protection layer is performed using atomic layer deposition, wherein the atomic layer deposition is repeated a number of times for deposition of the protection layer to a predetermined thickness.

24. The method of claim 22, wherein the protection layer comprises $SiO_2$, $Si_3N_4$, or SiN or wherein the protection layer comprises a metallic material comprising titanium, nickel, copper, or palladium, thereby forming a lead that connects the first graphene layer and the second graphene layer.

25. The method of claim 22, wherein the protection layer comprises:
a first protection layer comprising a first dielectric; and
a second protection layer overlaid on the first protection layer, wherein the second protection layer comprises a second dielectric that is different than the first dielectric.

26. The method of claim 22, wherein the protection layer comprises a plurality of layers and wherein successive layers within the plurality of layers alternate between a first material and a different second material.

27. The method of claim 22, wherein passivating the first side wall comprises:
oxidizing the substrate to form a first oxidation layer on the first surface, a second oxidation layer on the second surface and a third oxidation layer on the first side wall; and
selectively removing the first oxidation layer and the second oxidation layer, thereby retaining the third oxidation layer on the first side wall.

28. The method of claim 1, wherein the concurrently generating (B) comprises heating the substrate to concurrently form the first graphene layer on the first surface and the second graphene layer on the second surface, wherein the heating the substrate comprises exposing the substrate to a plurality of heat cycles with quenching, or rapid thermal anneal including a pulsed source, between heat cycles in the plurality of heat cycles.

29. The method of claim 1, wherein the first element is a rib and wherein an orthogonal projection of the rib on the common plane has a length and a width, and wherein the length is at least two times the width.

30. A graphite-based structure fabricated by the method of any proceeding claim wherein the graphite-based structure includes one or more diodes, one or more transistors, one or more LEDs, one or more solar cells, one or more photodetectors, or a combination thereof.

* * * * *